(12) United States Patent
Geiger et al.

(10) Patent No.: US 12,538,586 B2
(45) Date of Patent: Jan. 27, 2026

(54) VERTICAL DIODES EXTENDING THROUGH SUPPORT STRUCTURES

(71) Applicant: Intel Corporation, Santa Clara, CA (US)

(72) Inventors: Richard Geiger, Munich (DE); Georgios Panagopoulos, Munich (DE); Johannes Xaver Rauh, Kirchseeon (DE); Harald Gossner, Riemerling (DE)

(73) Assignee: Intel Corporation, Santa Clara, CA (US)

( * ) Notice: Subject to any disclaimer, the term of this patent is extended or adjusted under 35 U.S.C. 154(b) by 922 days.

(21) Appl. No.: 17/530,618

(22) Filed: Nov. 19, 2021

(65) Prior Publication Data

US 2023/0163120 A1    May 25, 2023

(51) Int. Cl.
| | |
|---|---|
| *H10D 89/60* | (2025.01) |
| *H10D 8/01* | (2025.01) |
| *H10D 8/50* | (2025.01) |
| *H10D 8/60* | (2025.01) |

(52) U.S. Cl.
CPC .......... *H10D 89/931* (2025.01); *H10D 8/045* (2025.01); *H10D 8/051* (2025.01); *H10D 8/50* (2025.01); *H10D 8/60* (2025.01); *H10D 89/611* (2025.01)

(58) Field of Classification Search
CPC ...... H10D 89/931; H10D 8/045; H10D 8/051; H10D 8/50; H10D 8/60; H10D 89/611; H10D 8/411; H10D 8/80; H10D 8/422; H10D 8/00–825; H01L 23/481; H01L 23/535; H01L 23/522–53295
See application file for complete search history.

(56) References Cited

U.S. PATENT DOCUMENTS

| | | | |
|---|---|---|---|
| 2009/0273868 A1 | 11/2009 | Liu et al. | |
| 2012/0038056 A1* | 2/2012 | Cabral, Jr. | ........ H01L 21/76877 |
| | | | 438/643 |
| 2012/0200976 A1 | 8/2012 | Holland | |
| 2016/0359028 A1* | 12/2016 | Nakanishi | ............. H01L 23/552 |
| 2017/0047453 A1* | 2/2017 | Chu | .................... H10D 62/129 |
| 2017/0069625 A1 | 3/2017 | Hirabayashi et al. | |
| 2019/0326446 A1* | 10/2019 | Dudek | ..................... H10D 8/00 |
| 2020/0403103 A1* | 12/2020 | Pjencak | ............ H01L 21/76283 |

FOREIGN PATENT DOCUMENTS

CN    108054133 A    5/2018

\* cited by examiner

*Primary Examiner* — Shahed Ahmed
(74) *Attorney, Agent, or Firm* — Akona IP PC

(57) ABSTRACT

Disclosed herein are IC devices, packages, and device assemblies that include diodes arranged so that their first and second terminals may be contacted from the opposite faces of a support structure. Such diodes are referred to herein as "vertical diodes" to reflect the fact that the diode extends, in a vertical direction (i.e., in a direction perpendicular to the support structure), between the bottom and the top of support structures. Vertical diodes as described herein may introduce additional degrees of freedom in diode choices in terms of, e.g., high-voltage handling, capacitance modulation, and speed.

20 Claims, 15 Drawing Sheets

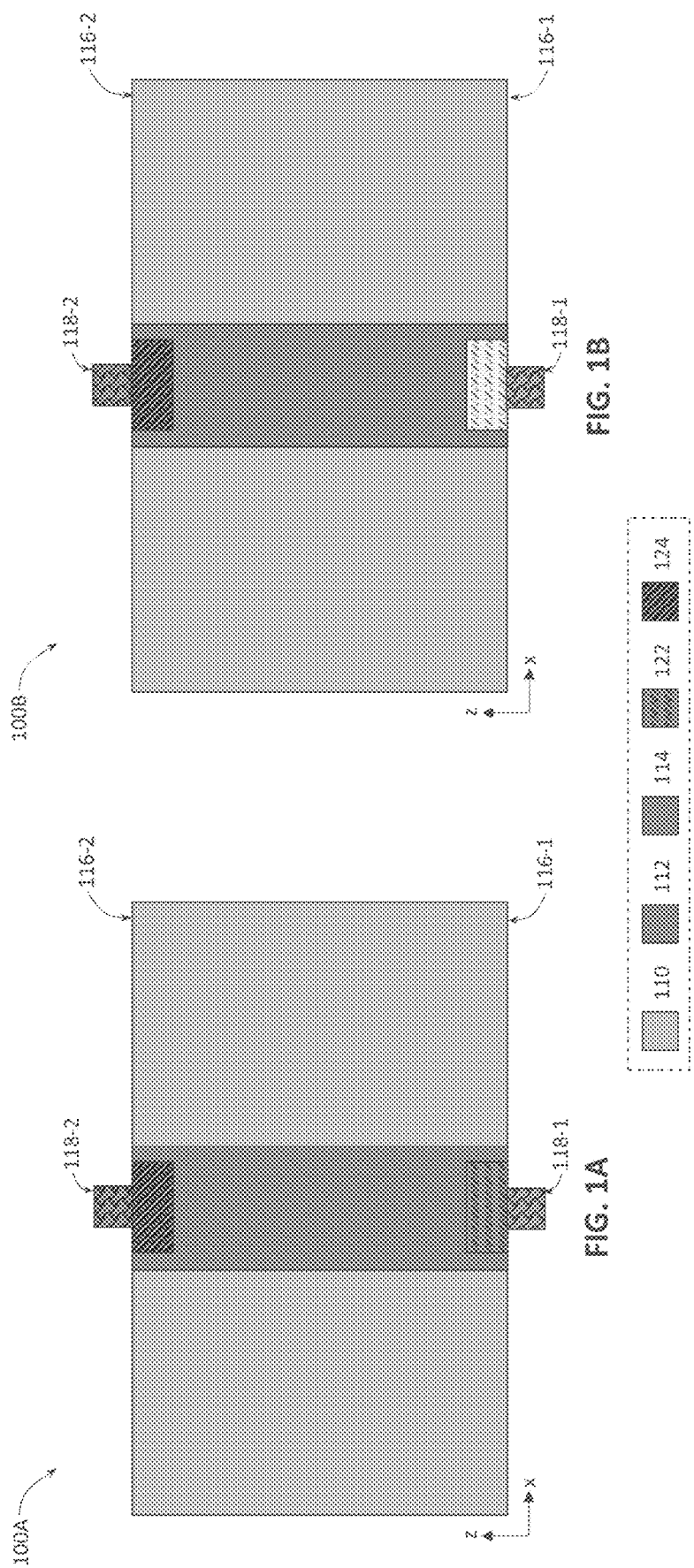

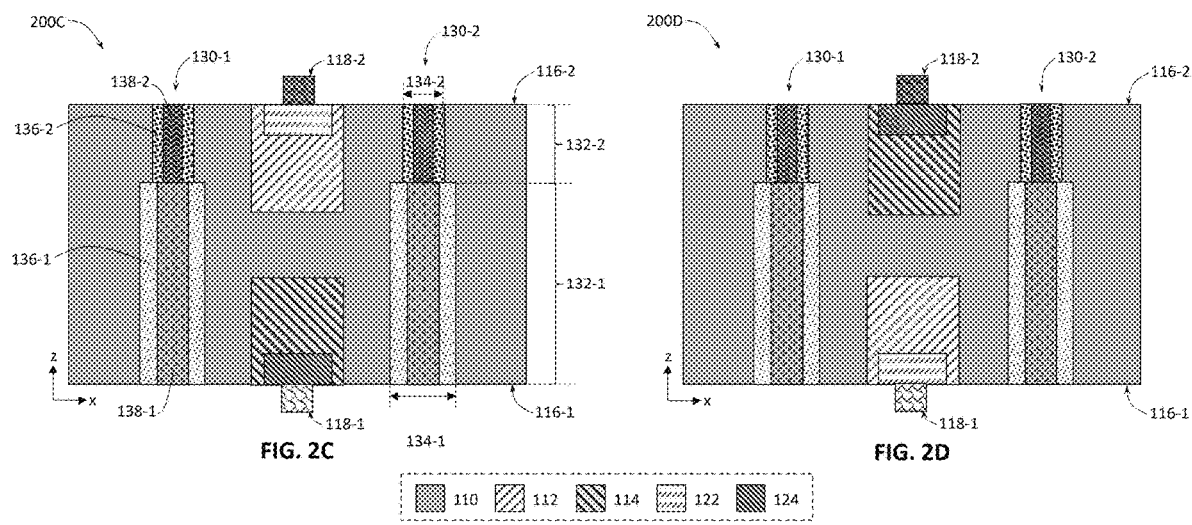

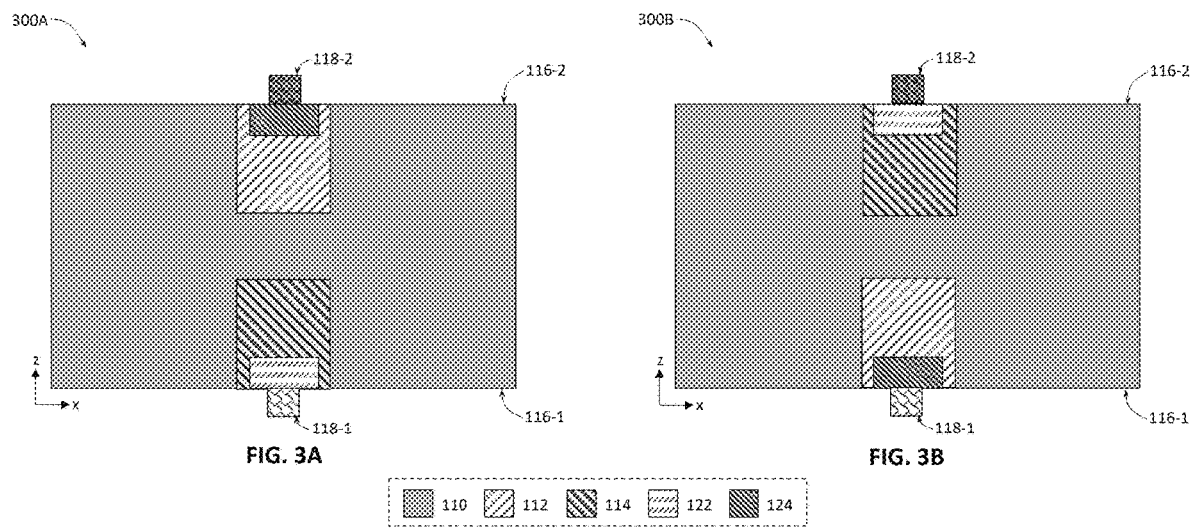

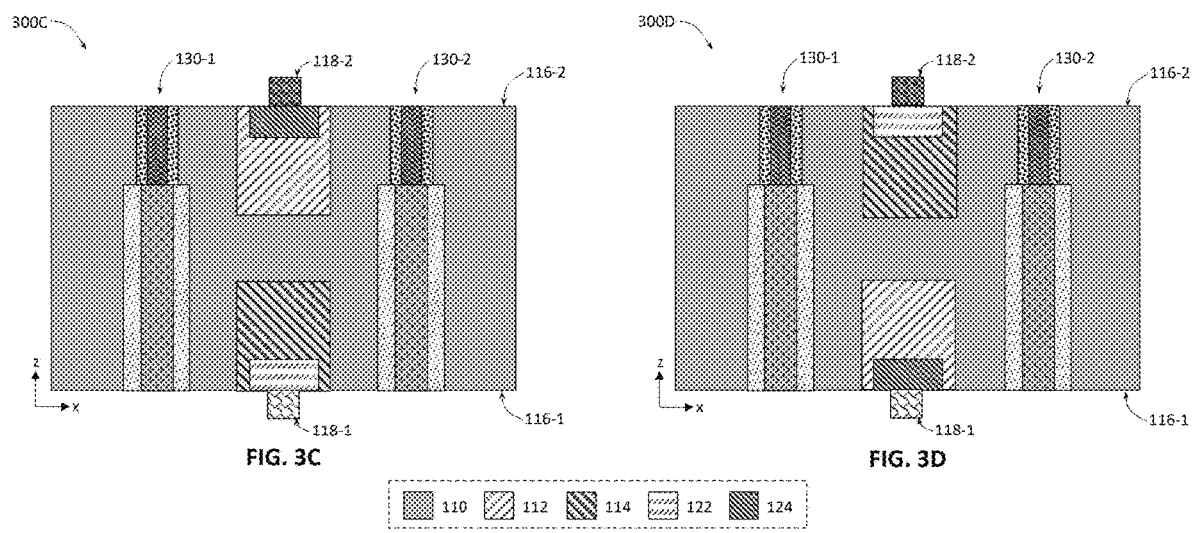

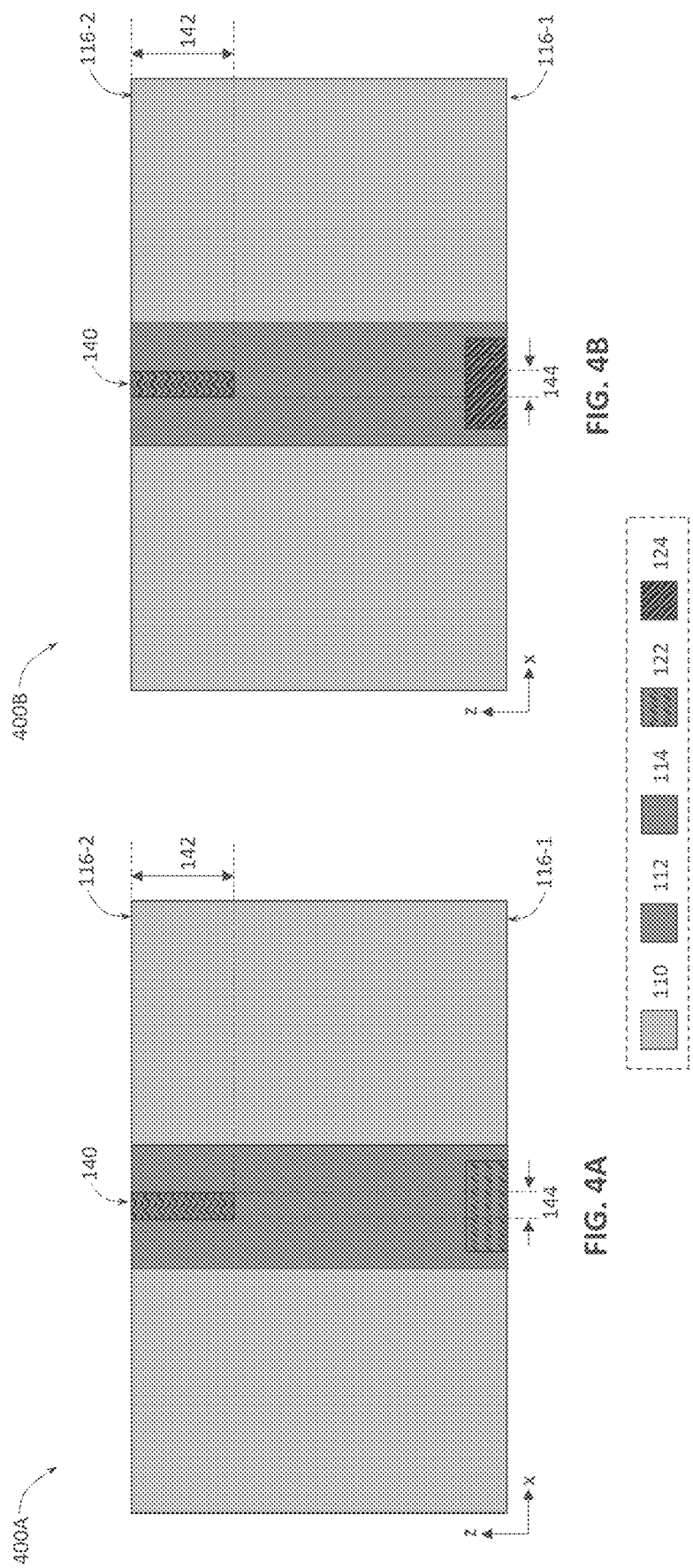

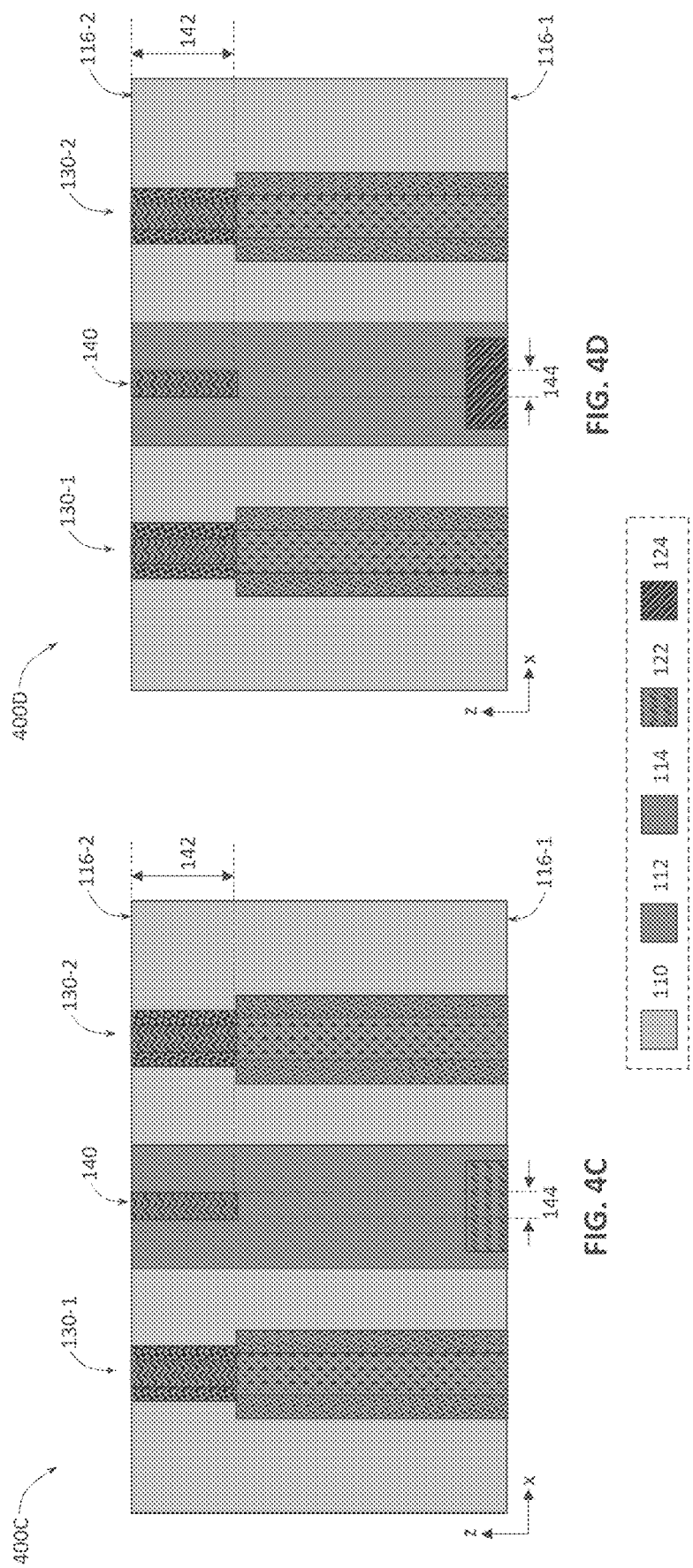

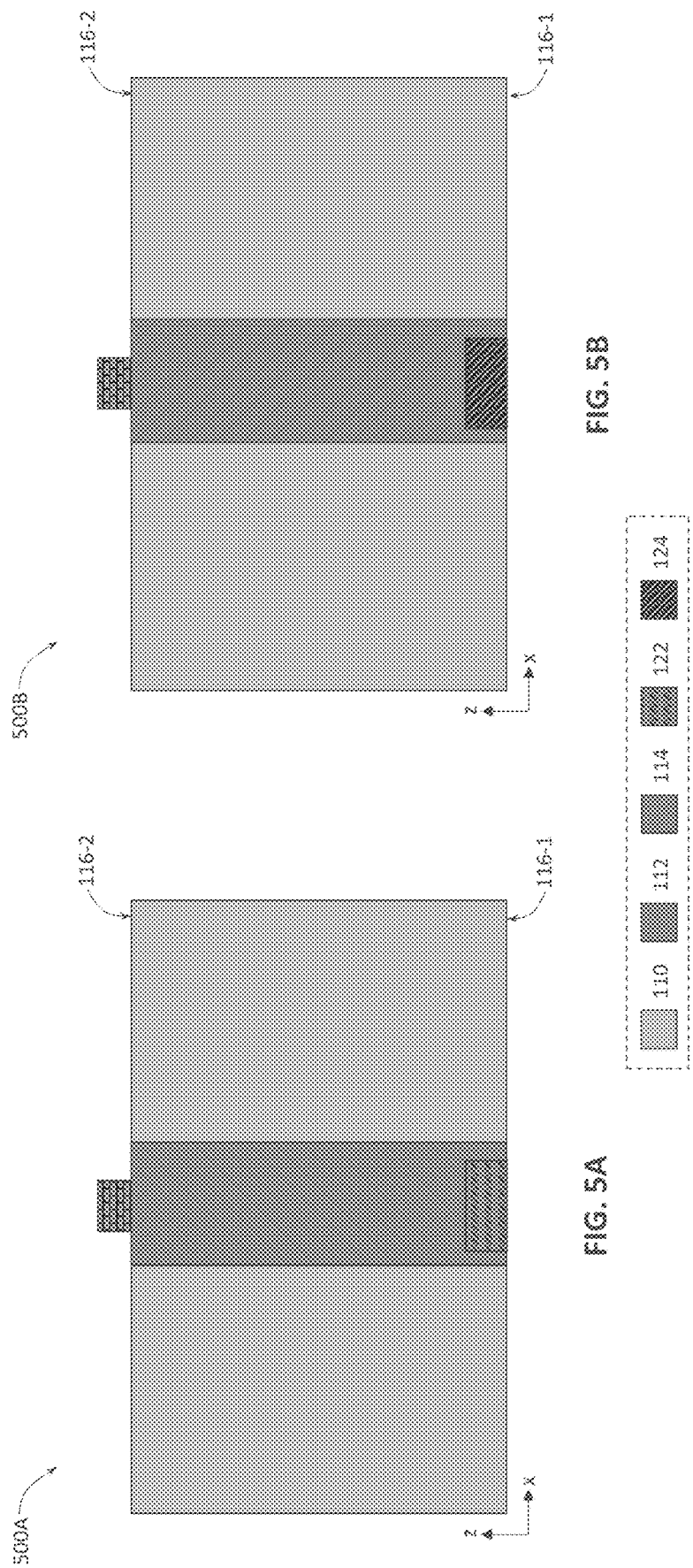

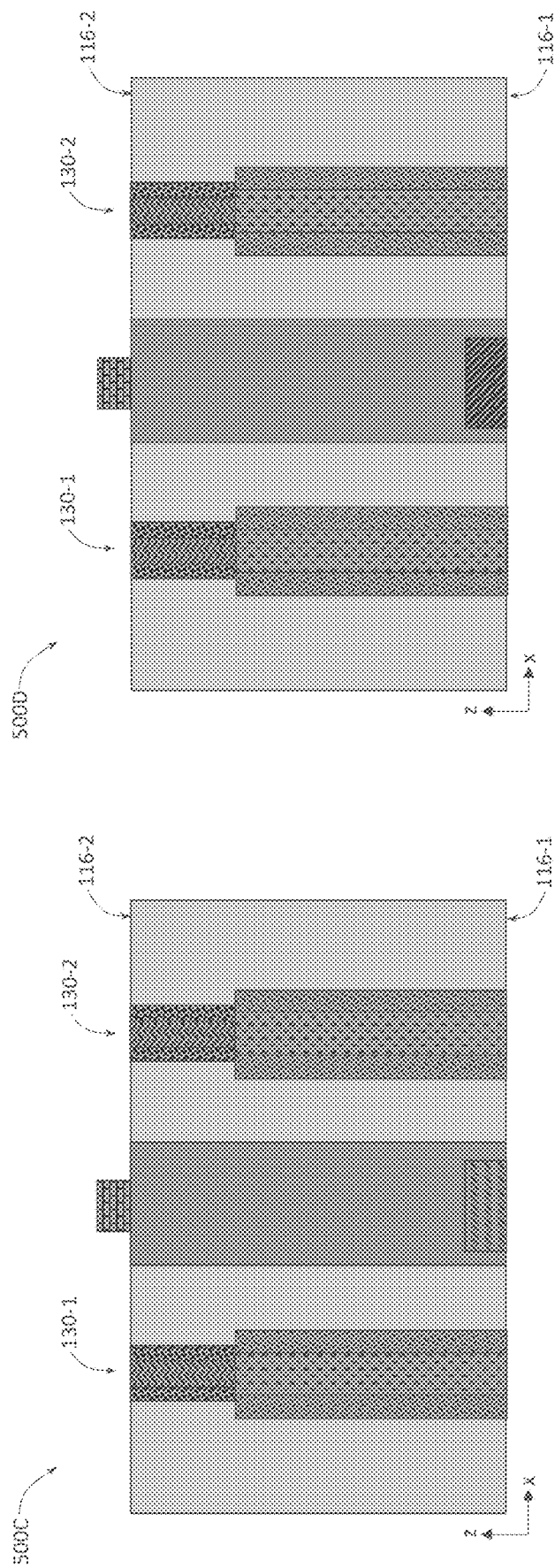

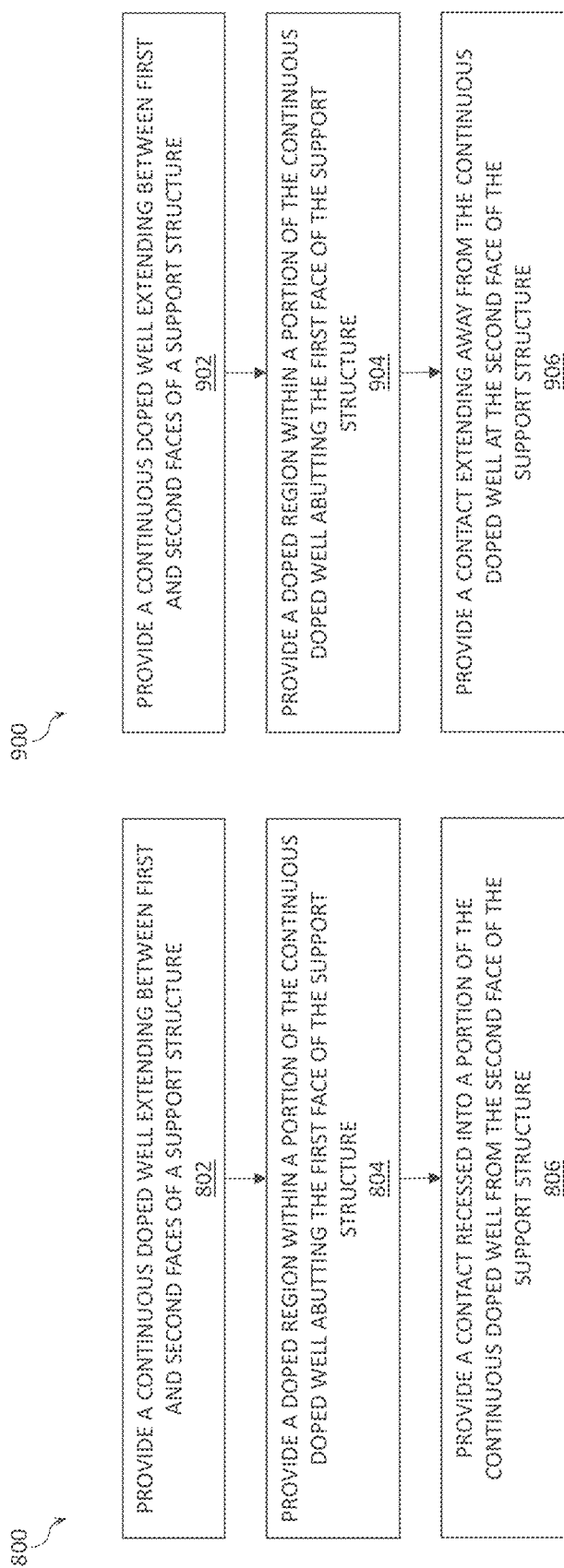

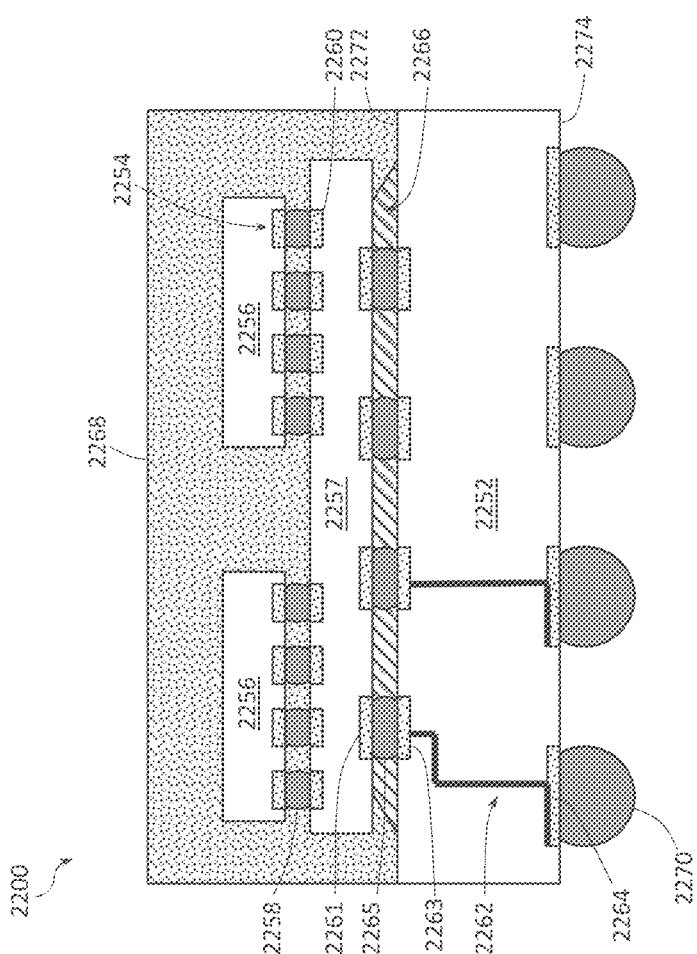

VERTICAL DIODES EXTENDING THROUGH SUPPORT STRUCTURES

BACKGROUND

A diode is a two-terminal electronic component that conducts current primarily in one direction. Semiconductor diodes are one of the key components for a variety of applications in complementary metal-oxide-semiconductor (CMOS) technology and beyond. For example, with CMOS process technology scaling, the robustness of transistors may be compromised due to the lower breakdown voltage for thinner gate oxides used in scaled transistors. Consequently, the protection of the transistor gates from any electrostatic discharge (ESD) currents becomes increasingly difficult to achieve, especially as high-speed applications put strict requirements on the designs. Since semiconductor diodes are one of the key components for ESD protection circuitry, exploring new designs for diode arrangements may lead to improvements in this important application, as well as in other applications where electronic components are used.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 1A-1B provide cross-sectional side views illustrating integrated circuit (IC) devices where vertical diodes extending through support structures are implemented using first and second doped regions provided at opposite faces of a support structure within a continuous doped well, according to some embodiments of the present disclosure.

FIGS. 2A-2D provide cross-sectional side views illustrating IC devices where vertical diodes extending through support structures are implemented using a first doped region provided at a first face of a support structure, within a first doped well, and using a second doped region provided at an opposing second face of the support structure, within a second doped well, where the first doped well and the first doped region include dopants of a first type and the second doped well and the second doped region include dopants of a second type, according to some embodiments of the present disclosure.

FIGS. 3A-3D provide cross-sectional side views illustrating IC devices where vertical diodes extending through support structures are implemented using a first doped region provided at a first face of a support structure, within a first doped well, and using a second doped region provided at an opposing second face of the support structure, within a second doped well, where the first doped well and the second doped region include dopants of a first type and the second doped well and the first doped region include dopants of a second type, according to some embodiments of the present disclosure.

FIGS. 4A-4D provide cross-sectional side views illustrating IC devices where vertical diodes extending through support structures are implemented using a continuous doped well extending between a first face and an opposing second face of a support structure, a doped region at the first face of the support structure, and a contact recessed into the doped well from the second face of the support structure, according to some embodiments of the present disclosure.

FIGS. 5A-5D provide cross-sectional side views illustrating IC devices where vertical diodes extending through support structures are implemented using a continuous doped well extending between a first face and an opposing second face of a support structure, a doped region at the first face of the support structure, and a contact extending away from the doped well from the second face of the support structure, according to some embodiments of the present disclosure.

FIGS. 6-9 provide flow diagrams of example methods of manufacturing IC devices with vertical diodes extending through support structures, in accordance with various embodiments of the present disclosure.

FIG. 11 is a cross-sectional side view of an IC package that may include one or more IC devices having one or more vertical diodes extending through support structures in accordance with any of the embodiments of the present disclosure.

DETAILED DESCRIPTION

Figures 2A, 2B:
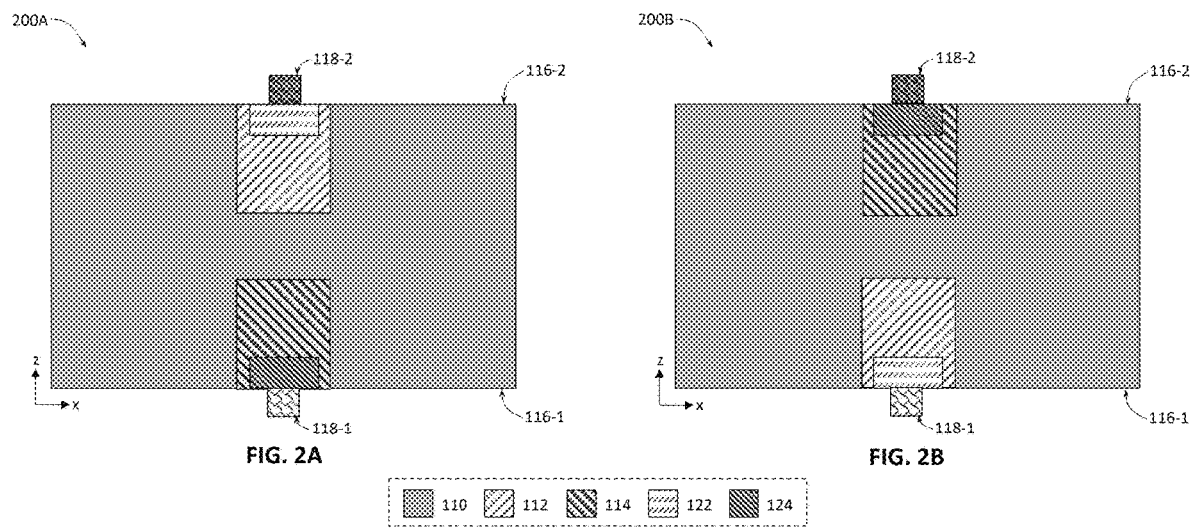

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

In conventional bulk CMOS processes diodes are typically incorporated in the form where all terminals of a diode are contacted from a single surface of a support structure (e.g., a substrate, a wafer, or a chip), typically from the top. In contrast to such conventional implementations, disclosed herein are IC devices, packages, and device assemblies that include diodes arranged so that their first and second terminals may be contacted from the opposite faces of a support structure. Such diodes are referred to herein as "vertical diodes" to reflect the fact that the diode extends, in a vertical direction (i.e., in a direction perpendicular to the support structure), between the bottom (e.g., the back) and the top (e.g., the front) of support structures. Vertical diodes as described herein may introduce additional degrees of freedom in diode choices in terms of, e.g., high-voltage handling, capacitance modulation, and speed. In addition, having diode terminals not only at the front of a support structure but also at the back can, advantageously, be integrated with back-side power delivery because for back-side power delivery support structures are typically thinned to the order of about 500 nanometers, thereby enabling entirely new device architectures and enhancing device capabilities.

IC devices as described herein, in particular IC devices that include vertical diodes extending through support structures, may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. In some embodiments, IC devices as described herein may be included in a radio frequency IC (RFIC), which may, e.g., be included in any component associated with an IC of a radio frequency (RF) receiver, an RF transmitter, or an RF transceiver, e.g., as used in telecommunications within base stations (BS) or user equipment (UE). Such components may include, but are not limited to, power amplifiers, low-noise amplifiers, RF filters (including arrays of RF filters, or RF filter banks), switches, upconverters, downconverters, and duplexers. In some embodiments, IC devices as described herein may be included in ESD protection devices or circuits. In some embodiments, the IC devices as described herein may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations. The terms "substantially," "close," "approximately," "near," and "about," generally refer to being within +/−10% of a target value, e.g., within +/−5% of a target value, based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

In the following description, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 1A-1B, such a collection may be referred to herein without the letters, e.g., as "FIG. 1."

In the drawings, while some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of one or more vertical diodes extending through support structures as described herein.

Various operations may be described as multiple discrete actions or operations in turn, in a manner that is most helpful in understanding the claimed subject matter. However, the order of description should not be construed as to imply that these operations are necessarily order dependent. These operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

FIGS. 1A-1B provide cross-sectional side views illustrating IC devices 100 where vertical diodes extending through support structures are implemented using first and second doped regions provided at opposite faces of a support structure within a continuous (i.e., single) doped well, according to some embodiments of the present disclosure. A legend provided within a dashed box at the bottom of FIGS. 1A-1B illustrates colors/patterns used to indicate some of the elements of the IC devices 100 so that FIGS. 1A-1B are not cluttered by too many reference numerals. For example, FIGS. 1A-1B use different colors/patterns to illustrate a support structure 110, an N-well 112, a P-well 114, an N-doped region 122, and a P-doped region 124.

The support structure 110 may have a first face 116-1 and a second face 116-2, the second face 116-2 being opposite the first face 116-1. In some implementations, the first face 116-1 as shown in the IC devices of the present drawings may be the back of the support structure 110, while the second face 116-2 may be the front of the support structures 110 (i.e., a portion in which further IC components such as front-end transistors, not specifically shown in the present drawings, may be provided). However, in other implementations, the first face 116-1 as shown in the IC devices of the present drawings may be the front of the support structure 110, while the second face 116-2 may be the back of the support structures 110. The support structure 110 may be any suitable support structure, e.g., a substrate, a die, a wafer, or a chip, in which vertical diodes as described herein may be implemented. In some embodiments, the support structure 110 may include a semiconductor, such as silicon. In other implementations, the support structure 110 may include/be alternate materials, which may or may not be combined with silicon, such as germanium, indium antimonide, lead telluride, indium arsenide, indium phosphide, gallium arsenide, indium gallium arsenide, gallium antimonide, or other combinations of group III-N, group III-V, or group IV materials. Although a few examples of materials from which the support structure 110 may be formed are described here, any material that may serve as a foundation upon which at least one vertical diode extending through a support structure as described herein may be built falls within the spirit and scope of the present disclosure.

FIG. 1A illustrates an embodiment of an IC device 100A where an N-well 112 extends between the first face 116-1 and the second face 116-2 of the support structure 110, with an N-doped region 122 and a P-doped region 124 included in opposite portions of the N-well 112. In particular, as shown in FIG. 1A, the N-doped region 122 may be provided in a portion of the N-well 112 that extends from the first face 116-1 of the support structure 110 towards, but not reaching, the P-doped region 124, while the P-doped region 124 may be provided in a portion of the N-well 112 that extends from the second face 116-2 of the support structure 110 towards, but not reaching, the N-doped region 122. On the other hand, FIG. 1B illustrates an embodiment of an IC device 100B where a P-well 114 extends between the first face 116-1 and the second face 116-2 of the support structure 110, with the N-doped region 122 provided in a portion of the P-well 114 that extends from the first face 116-1 of the support structure 110 towards, but not reaching, the P-doped region 124, and the P-doped region 124 provided in a portion of the P-well 114 that extends from the second face 116-2 of the support structure 110 towards, but not reaching, the N-doped region 122.

As used herein, the N-well 112 and the P-well 114 refer to regions of a semiconductor material (which may include a plurality of different semiconductor materials) doped with, respectively N-type dopants and P-type dopants, in dopant concentrations that are higher than the dopant concentration in the support structure 110 outside of these wells, but lower than the dopant concentration in, respectively, the N-doped region 122 and the P-doped region 124. For example, in some embodiments, a dopant concentration of the support structure 110 outside of the N-well 112 and the P-well 114 may be lower than about $10^{16}$ dopants per cubic centimeter, e.g., lower than about $5 \times 10^{15}$ dopants per cubic centimeter, a dopant concentration of the N-doped region 122 or of the P-doped region 124 may be greater than about $10^{19}$ dopants per cubic centimeter, e.g., greater than about $5 \times 10^{19}$ dopants per cubic centimeter, and a dopant concentration of the N-well 112 or the P-well 114 may be greater than the dopant concentration of the support structure 110 outside of the N-well 112 and the P-well 114 and lower than the dopant concentration of the N-doped region 122 or of the P-doped region 124 (e.g., between about $5 \times 10^{16}$ dopants per cubic centimeter and $5 \times 10^{18}$ dopants per cubic centimeter). In the following, reference to a "dopant concentration of a support structure" implies a dopant concentration in a portion of the support structure 110 outside of the N-well 112 and the P-well 114. As is known in the field of semiconductor devices, both N-type and P-type dopants may be present within a semiconductor material, but the term "N-well" refers to a doped well where the amount of N-type dopants is higher, typically significantly higher, than the amount of P-type dopants, while the term "P-well" refers to a doped well where the amount of P-type dopants is higher, typically significantly higher, than the amount of N-type dopants. Similarly, the term "N-doped region" refers to a doped region where the amount of N-type dopants is higher, typically significantly higher, than the amount of P-type dopants, while the term "P-doped region" refers to a doped region where the amount of P-type dopants is higher, typically significantly higher, than the amount of N-type dopants. Reference to a "dopant concentration" in these wells and regions implies dopant concentrations of the type of dopants with the greater amount. For example, a dopant concentration of the N-doped region 122 being at a certain level refers to the dopant concentration of the N-type dopants, while a dopant concentration of the P-doped region 124 being at a certain level refers to the dopant concentration of the P-type dopants.

The IC devices 100A and 100B are similar in that each of them includes the N-doped region 122 abutting the first face 116-1 of the support structure 100 and the P-doped region 124 abutting the second face 116-2 of the support structure 100. The IC devices 100A and 100B are different in that, in the IC device 100A, the N-doped region 122 and the P-doped region 124 are provided within the N-well 112, while, in the IC device 100B, the N-doped region 122 and the P-doped region 124 are provided within the P-well 114. Thus, the IC devices 100 as shown in FIGS. 1A-1B may be generalized as an IC device that includes a support structure having a first face and an opposing second face, a doped well extending between the first face and the second face of the support structure, a first doped region within the doped well, extending from the first face of the support structure towards, but not reaching, a second doped region, and a second doped region within the doped well, extending from the second face of the support structure towards, but not reaching, the first doped region, where the first and second doped regions are doped regions of different types of dopants (e.g., the first doped region may be an N-type doped region and the second doped region may be a P-type doped region, or vice versa). Together, the doped well and the first and second doped regions of the IC devices 100 form a vertical diode, where the first doped region provides a first terminal of the vertical diode and the second doped region provides a second terminal of the vertical diode.

The IC devices 100 may be an example of shallow junction PN diodes. Instead of a ring-shaped well contact, which is the typical layout style for conventional junction diodes in current state-of-the-art technologies, the well contacts for the IC devices 100 may be implanted on the same lateral area of the shallow junction, but on the opposite side of the support structure 110, resulting in a significant reduction of the diode footprint. Besides area savings, implementing vertical diodes such as the IC devices 100 may advantageously reduce the parasitic wiring resistance.

In various embodiments of the IC devices 100, the N-doped region 122 and the P-doped region 124 may be separated from one another by at least 80 nanometers, including all values and ranges therein, e.g., by at least 200 nanometers, or by at least 450 nanometers. In general, the distance between the N-doped region 122 and the P-doped region 124 in the IC devices 100 (e.g., a dimension measured along the z-axis of the example coordinate system shown in the present drawings) may be at least about 80% of the thickness of the support structure 110 (also a dimension measured along the z-axis of the example coordinate system shown), e.g., at least about 90% of the thickness of the support structure. In various embodiments of the IC devices 100, a depth of the N-doped region 122 or the P-doped region 124 (also a dimension measured along the z-axis of the example coordinate system shown) may be between about 2 and 100 nanometers, including all values and ranges therein, e.g., between about 2 and 50 nanometers, or between about 2 and 10 nanometers. In general, the depth of the N-doped region 122 or the P-doped region 124 may be between about 1% and 15% of the thickness of the support structure 110, e.g., between about 2% and 5% of the thickness of the support structure 110. In various embodiments, the thickness of the support structure 110 (i.e., a distance between the first face 116-1 and the second face 116-2) may be between about 100 and 5000 nanometers, including all values and ranges therein, e.g., between about 200 and 2000 nanometers, or between about 400 and 600 nanometers.

In some embodiments, any of the IC devices 100 may further include a first contact 118-1, electrically coupled to the N-doped region 122 at the first face 116-1 of the support structure 110, and a second contact 118-2, electrically coupled to the P-doped region 124 at the second face 116-2 of the support structure 110. One example of such contacts 118 is illustrated in FIGS. 1A-1B, although in other embodiments, the contacts 118 may be of any suitable geometry (e.g., they may be narrower, wider, may be implemented as a conductive line or a conductive via), and, in any of the embodiments, any of the first and second contacts 118-1, 118-2 may be at least partially recessed within the corresponding doped region, e.g., as described below with reference to the recessed contacts of FIGS. 4A-4D.

Besides shallow junction PN diodes, embodiments of the present disclosure provide vertical diodes implemented as PIN diodes. Some examples for such a PIN diode are shown in FIG. 2, where the position of P-well and N-well could be interchanged. In some implementations, PIN diode architecture may be advantageous over the PN diode architecture in that it may have an extended depletion region, which is defined by the relatively low-doped region of the support structure 110 between the N-well and the P-well. Due to the larger depletion zone, PIN diodes may be able to withstand a larger bias drop compared PN diodes. Different flavors of high-voltage diodes could be formed by adjusting the depth of the implanted P-well and N-well and, hence, varying the length of the depletion zone. Moreover, this kind of device may offer improved performance in terms of capacitance and leakage current.

FIGS. 2A-2D provide cross-sectional side views illustrating IC devices 200 where vertical diodes extending through support structures are implemented using a first doped region provided at a first face of a support structure, within a first doped well, and using a second doped region provided at an opposing second face of the support structure, within a second doped well, where the first doped well and the first doped region include dopants of a first type and the second doped well and the second doped region include dopants of a second type, according to some embodiments of the present disclosure. A legend provided within a dashed box at the bottom of FIGS. 2A-2D illustrates colors/patterns used to indicate some of the elements of the IC devices 200 so that FIGS. 2A-2D are not cluttered by too many reference numerals. In particular, FIGS. 2A-2D use the same colors/patterns as those used in FIG. 1 to illustrate the support structure 110, the N-well 112, the P-well 114, the N-doped region 122, and the P-doped region 124, each of which individually may be as described with reference to FIG. 1. Therefore, in the interests of brevity, individual descriptions of the support structure 110, the N-well 112, the P-well 114, the N-doped region 122, and the P-doped region 124 are not repeated for FIGS. 2A-2D and only the differences in their arrangements, from those shown in FIGS. 1A-1B, are described.

In particular, the IC devices 200 are different from the IC devices 100 in that two doped well are implemented proximate the opposite faces of the support structure 100, with each of the two doped wells including a doped region with the same type of dopants as that doped well. For example, FIG. 2A illustrates an embodiment of an IC device 200A where the P-well 114 extends from the first face 116-1 towards, but not reaching, the N-well 112 that is proximate the second face 116-2 of the support structure 110. In the IC device 200A, the P-doped region 124 is included in the P-well 114, where it extends from the first face 116-1 towards, but not reaching, the end of the P-well 114 (i.e., the P-doped region 124 is shallower than the P-well 114), while the N-doped region 122 is included in the N-well 112, where it extends from the second face 116-2 towards, but not reaching, the end of the N-well 112 (i.e., the N-doped region 122 is shallower than the N-well 112). On the other hand, FIG. 2B illustrates an embodiment of an IC device 200B where the N-well 112 extends from the first face 116-1 towards, but not reaching, the P-well 114 that is proximate the second face 116-2 of the support structure 110. In the IC device 200B, the N-doped region 122 is included in the N-well 112, where it extends from the first face 116-1 towards, but not reaching, the end of the N-well 112 (i.e., similar to the IC device 200A, the N-doped region 122 is shallower than the N-well 112), while the P-doped region 124 is included in the P-well 114, where it extends from the second face 116-2 towards, but not reaching, the end of the P-well 114 (i.e., similar to the IC device 200A, the P-doped region 124 is shallower than the P-well 114).

In each the IC device 200A and the IC device 200B, one of the doped wells and the corresponding doped region therein includes dopants of a first type (e.g., N-type dopants), while the other one of the doped wells and the corresponding doped region therein includes dopants of a second type (e.g., P-type dopants). In other words, the N-doped region 122 is included in the N-well 112 and the P-doped region 124 is included in the P-well 114 for each of the IC device 200A and the IC device 200B. The support structure 110 may include either P-type or N-type dopants, but in lower dopant concentrations than the wells 112, 114, or the support structure 110 may include a substantially intrinsic semiconductor material.

In various embodiments of the IC devices 200, the N-doped region 122 and the P-doped region 124 may be separated from one another by distances as described above with reference to FIG. 1. In various embodiments of the IC devices 200, depths of the N-doped region 122 and the P-doped region 124 may be as described above with reference to FIG. 1. In various embodiments of the IC devices 200, first and second contacts 118-1 and 118-2 may be coupled to respective doped regions at, respectively, the first face 116-1 and the second face 116-2 of the support structure 110, as described above with reference to FIG. 1.

Further dimensions may be defined for the IC devices 200 that unique to the embodiments of FIG. 2, compared to those of FIG. 1, because of the two individual doped wells being included in each of the diode arrangements of FIG. 2. For example, in various embodiments of the IC devices 200, the N-well 112 may be separated from the P-well 114 by at least 50 nanometers, including all values and ranges therein, e.g., at least 100 nanometers, or at least 200 nanometers. In general, the distance between the N-well 112 and the P-well 114 in the IC devices 200 may be at least about 10% of the thickness of the support structure 110, e.g., at least about 40% of the thickness of the support structure 110. In another example of a further dimension for the IC devices 200, a depth of either the N-well 112 or the P-well 114 in a direction perpendicular to the support structure 110 may be between about 50 and 4000 nanometers, including all values and ranges therein, e.g., between about 100 and 1000 nanometers, or between about 100 and 250 nanometers. In general, such a dimension may be between about 10% and 80% of the thickness of the support structure 110, e.g., between about 20 and 30% of the thickness of the support structure 110.

The IC devices 200 as shown in FIGS. 2A-2D may be generalized as an IC device that includes a support structure having a first face and an opposing second face; a first doped well and a second doped well, where the first doped well extends from the first face of the support structure towards, but not reaching, the second doped well, and where the second doped well extends from the second face of the support structure towards, but not reaching, the first doped well; and a first doped region and a second doped region, where the first doped region is within the first doped well and extends from the first face of the support structure towards, but not reaching, the end of the first doped well (i.e., the first doped region is shallower than the first doped well), and where the second doped region is within the second doped well and extends from the second face of the support structure towards, but not reaching, the end of the second doped well (i.e., the second doped region is shallower than the second doped well), where the first doped well and the first doped region include dopants of a first type (e.g., N-type dopants) and the second doped well and the second doped region include dopants of a second type (e.g., P-type dopants), or vice versa). Together, the first and second doped wells and the first and second doped regions of the IC devices 200 form a vertical diode, where the first doped region provides a first terminal of the vertical diode and the second doped region provides a second terminal of the vertical diode.

FIG. 2C illustrates an IC device 200C that is substantially the same as the IC device 200A of FIG. 2A, but further includes additional structures to implement what may be described as buried power rail (BPR) depletion control. Similarly, FIG. 2D illustrates an IC device 200D that is substantially the same as the IC device 200B of FIG. 2B, but further includes additional structures to implement BPR depletion control. In particular, each of the IC devices 200C and 200D illustrates an embodiment where at least one conductive via 130 may be provided proximate to the vertical diode formed by the N-well 112, the P-well 114, the N-doped region 122, and the P-doped region 124 as described with reference to FIGS. 2A and 2B. Two such vias openings 130 are shown in FIGS. 2C and 2D, one on either side of the vertical diode, but one of them may be absent in other embodiments.

A conductive via 130 may extend between the first face 116-1 and the second face 116-2 of the support structure 110, and may be lined with at least one insulator material and at least partially filled with at least one electrically conductive material. In some embodiments, a given conductive via 130 may include a first portion 132-1 and a second portion 132-2, where the first portion 132-1 is a portion of the conductive via 130 that starts at the first face 116-1 and extends towards the second face 116-2, the second portion 132-2 is a portion that starts at the second face 116-2 and extends towards the first face 116-1, and the first portion 132-1 and the second portion 132-2 meet/abut one another to form a single conductive via 130. In some embodiments, one or more of a width of a portion 132, an insulator material lining a portion 132, and an electrically conductive material at least partially filling a portion 132 may be different for the first portion 132-1 and the second portion 132-2 in any given conductive via 130. FIGS. 2C and 2D illustrate the most general case where each of the width of a portion 132, the insulator material lining a portion 132, and the electrically conductive material at least partially filling a portion 132 are different for the first portion 132-1 and the second portion 132-2 in any given conductive via 130, but, in other embodiments, some of the width, the insulator material, and the electrically conductive material may be the same. As shown only in FIG. 2C in order to not clutter other drawings but applicable also to the IC device 200D of FIG. 2D as well as to the conductive vias 130 shown in the subsequent drawings, in some embodiments, a width 134-1 of the first portion 132-1 (a dimension measured along the x-axis of the example coordinate system shown) may be larger than a width 134-2 of the second portion 132-2, e.g., at least about 50 nanometers larger, including all values and ranges therein, e.g., between about 100 and 400 nanometers larger. As also shown only in FIG. 2C in order to not clutter other drawings but applicable also to the IC device 200D of FIG. 2D as well as to the conductive vias 130 shown in the subsequent drawings, in some embodiments, the first portion 132-1 may include a first insulator material 136-1 and a first electrically conductive material 138-1, while the second portion 132-2 may include a second insulator material 136-2 and a second electrically conductive material 138-2. In various embodiments, the first insulator material 136-1 and the second insulator material 136-2 may include the same or different material compositions. In various embodiments, the first electrically conductive material 138-1 and the second electrically conductive material 138-2. Furthermore, in various embodiments, the arrangements of different instances of the conductive vias 130 within a single IC device may be different from one another in one of more of widths, insulator materials, or electrically conductive materials. In some embodiments, a distance from the electrically conductive material 138-1 or 138-2 to the N-well 112 or to the P-well 114 may be between about 10 and 250 nanometers, including all values and ranges therein, e.g., between 25 and 150 nanometers, or between 25 and 75 nanometers.

In some embodiments, the second portion 132-2 may be implemented as a BPR, while the first portion 132-1 may be implemented as a micro-through-silicon-via (micro-TSV). Provision of at least one such conductive via 130 proximate to the diode allows modulating the depletion region of the diode by applying appropriate bias to the conductive via 130. In this manner, a 3-terminal device is created where the depletion region is not only determined by the bias at the P-doped region and the N-doped region terminals, but can also be independently tuned by a bias applied to the conductive via 130. Instead of altering the well implant depth for increased voltage handling capability as discussed above, the BPR depletion biasing can be used to achieve vertical diodes for different voltage classes without the need for different diode implants. This enhancement holds similarly true for the use case as a varactor, where the depletion bias can enhance the diode's applicability as varactor for increased p-n bias (see, e.g., embodiments of FIGS. 3C-3D).

FIGS. 3A-3D provide cross-sectional side views illustrating IC devices 300 where vertical diodes extending through support structures are implemented using a first doped region provided at a first face of a support structure, within a first doped well, and using a second doped region provided at an opposing second face of the support structure, within a second doped well, where the first doped well and the second doped region include dopants of a first type and the second doped well and the first doped region include dopants of a second type, according to some embodiments of the present disclosure. A legend provided within a dashed box at the bottom of FIGS. 3A-3D illustrates colors/patterns used to indicate some of the elements of the IC devices 300 so that FIGS. 3A-3D are not cluttered by too many reference numerals. In particular, FIGS. 3A-3D use the same colors/patterns as those used in FIG. 1 and FIG. 2 to illustrate the support structure 110, the N-well 112, the P-well 114, the N-doped region 122, and the P-doped region 124, each of which individually may be as described with reference to FIG. 1 and FIG. 2. Therefore, in the interests of brevity, individual descriptions of the support structure 110, the N-well 112, the P-well 114, the N-doped region 122, and the P-doped region 124 are not repeated for FIGS. 3A-3D and only the differences in their arrangements, from those shown in FIGS. 1A-1B and FIGS. 2A-2D, are described.

In particular, the IC devices 300 shown in individual ones of FIGS. 3A-3D are substantially the same as the IC devices 200 shown in the corresponding ones of FIGS. 2A-2D, except that, in each the IC devices 300, each of the doped wells and the corresponding doped region therein include dopants of different types (e.g., if a doped well includes N-type dopants then the doped region included in that doped well includes P-type dopants, and vice versa), while the other one of the doped wells and the corresponding doped region therein includes dopants of a second type (e.g., P-type dopants). In other words, the P-doped region 124 is included in the N-well 112 and the N-doped region 122 is included in the P-well 114 for each of the IC devices 300. Other explanations provided with respect to FIGS. 2A-2D are applicable to FIGS. 3A-3D, where FIG. 3A illustrates an IC device 300A similar to the IC device 200A, FIG. 3B illustrates an IC device 300B similar to the IC device 200B, FIG. 3C illustrates an IC device 300C similar to the IC device 200C, and FIG. 3D illustrates an IC device 300D similar to the IC device 200D, each being similar except for the change in the dopant types as described above. The diodes illustrated in FIGS. 3A-3D may be silicon-controlled-rectifier (SCR) diodes and may be particularly advantageous for ESD protection purposes. Distributing of contacts to front and back sides of the support structure 110 may significantly reduce the device footprint for this important class of diodes.

Next class of diodes that may be implemented as vertical diodes in accordance with some embodiments of the present disclosure are Schottky diodes, some examples of which are shown in FIGS. 4A-4C and FIGS. 5A-5D. In contrast to PN diodes, Schottky diodes rely on the transport of majority carriers. Hence, faster switching times may be achieved and the addition of a Schottky diode to the process may add a valuable device that is particularly advantageous for high-frequency applications.

FIGS. 4A-4D provide cross-sectional side views illustrating IC devices 400 where vertical diodes extending through support structures are implemented using a continuous (i.e., single) doped well extending between a first face and an opposing second face of a support structure, a doped region at the first face of the support structure, and a contact recessed into the doped well from the second face of the support structure, according to some embodiments of the present disclosure. A legend provided within a dashed box at the bottom of FIGS. 4A-4D illustrates colors/patterns used to indicate some of the elements of the IC devices 400 so that FIGS. 4A-4D are not cluttered by too many reference numerals. In particular, FIGS. 4A-4D use the same colors/patterns as those used in FIG. 1 to illustrate the support structure 110, the N-well 112, the P-well 114, the N-doped region 122, and the P-doped region 124, each of which individually may be as described with reference to FIG. 1. Therefore, in the interests of brevity, individual descriptions of the support structure 110, the N-well 112, the P-well 114, the N-doped region 122, and the P-doped region 124 are not repeated for FIGS. 4A-4D and only the differences in their arrangements, from those shown in FIGS. 1A-1B, are described.

In particular, an IC device 400A, shown in FIG. 4A, is similar to the IC device 100A of FIG. 1A except that it does not include the P-doped region 124 at the second face 116-2 of the support structure 110 and, instead, a contact (e.g., to realize the diode anode) is to be made to the N-well 112, thus realizing a Schottky diode. This is in contrast to the contact being made to the P-doped region 124 as was the case for the PN diode of FIG. 1A. In some embodiments, a contact can be made to the N-well 112 of the IC device 400A using a contact 140 that is at least partially recessed into the support structure 110 from the second face 116-2 (i.e., from the side of the Schottky diode that does not include the N-doped region 122), as shown in FIG. 4A. The contact 140 may have a portion at the second face 116-2 of the support structure 110 and may extend, from the second face 116-2 towards, but not reaching, the N-doped region 122. Similarly, an IC device 400B, shown in FIG. 4B, is similar to the IC device 100B of FIG. 1B except that it does not include the N-doped region 122 at the second face 116-2 of the support structure 110 and, instead, a contact (e.g., to realize the diode anode) is to be made to the P-well 114, also realizing a Schottky diode. This is in contrast to the contact being made to the N-doped region 122 as was the case for the PN diode of FIG. 1B. In some embodiments, a contact can be made to the P-well 114 of the IC device 400B using the contact 140 as described with reference to FIG. 4A, i.e., a contact that is at least partially recessed into the support structure 110 from the second face 116-2 (i.e., from the side of the Schottky diode that does not include the P-doped region 124), as shown in FIG. 4B. In the IC device 400B, the contact 140 has a portion at the second face 116-2 of the support structure 110 and may extend, from the second face 116-2 towards, but not reaching, the P-doped region 124.

In some embodiments, a depth 142 to which the contact 140 extends from the second face 116-2 into the support structure 110 (i.e., a dimension measured along the z-axis of the example coordinate system shown) may be between about 20 and 2000 nanometers, including all values and ranges therein, e.g., between about 25 and 500 nanometers, or between about 50 and 150 nanometers. In general, the depth 142 may be between about 5% and 70% of the thickness of the support structure 110, e.g., between about 10% and 30% of the thickness of the support structure 110. In some embodiments, a width 144 of the contact 140 within the support structure 110 (i.e., a dimension measured along the x-axis of the example coordinate system shown) may be between about 25 and 2000 nanometers, including all values and ranges therein, e.g., between about 100 and 1000 nanometers, or between about 250 and 750 nanometers. The contact 140 of the IC devices 400A and 400B may be realized using a fabrication process similar to that used to form a BPR, except that a dielectric barrier lining the sidewalls and the bottom of an opening for a BPR may be omitted so that an electrically conductive material filling the opening may be in contact with the semiconductor material of the doped well (e.g., of the N-well 112 for the IC device 400A or of the P-well 114 for the IC device 400B), thus forming a Schottky contact with a relatively large surface area.

In some embodiments, a distance between the contact 140 and the opposing doped region, i.e., the N-doped region 122 for the embodiment of FIG. 4A and the P-doped region 124 for the embodiment of FIG. 4B, may be between about 100 and 4000 nanometers, including all values and ranges therein, e.g., between about 200 and 1000 nanometers, or between about 300 and 400 nanometers. More generally, a distance between the contact 140 and the opposing doped region may be at least about 80% of the thickness of the support structure 110, e.g., at least about 90% of the thickness of the support structure.

Although not specifically shown in FIGS. 4A and 4B, in some embodiments, the contact 140 may further have a portion that extends from the second face 116-2 of the support structure 110 away from the support structure 110 (i.e., upwards in the drawings of FIGS. 4A and 4B). Providing the contact 140 that is at least partially recessed into a doped well such as the N-well 112 or the P-well 114 advantageously allows realizing a contact with a larger contact area, which may lead to an improved current injection into the doped well.

FIG. 4C illustrates an IC device 400C that is substantially the same as the IC device 400A of FIG. 4A and FIG. 4D illustrates an IC device 400D that is substantially the same as the IC device 400B of FIG. 4B, but may further include one or more conductive vias 130 as were described with reference to FIGS. 2C-2D.

FIGS. 5A-5D provide cross-sectional side views illustrating IC devices 500 where vertical diodes extending through support structures are implemented using a continuous (i.e., single) doped well extending between a first face and an opposing second face of a support structure, a doped region at the first face of the support structure, and a contact 150 extending away from (i.e., not recessed as in FIG. 4) the doped well from the second face of the support structure, according to some embodiments of the present disclosure. A legend provided within a dashed box at the bottom of FIGS. 5A-5D illustrates colors/patterns used to indicate some of the elements of the IC devices 500 so that FIGS. 5A-5D are not cluttered by too many reference numerals. In particular, FIGS. 5A-5D use the same colors/patterns as those used in FIG. 4 to illustrate the support structure 110, the N-well 112, the P-well 114, the N-doped region 122, and the P-doped region 124, each of which individually may be as described with reference to FIG. 4. Therefore, in the interests of brevity, individual descriptions of the support structure 110, the N-well 112, the P-well 114, the N-doped region 122, and the P-doped region 124 are not repeated for FIGS. 5A-5D and only the differences in their arrangements, from those shown in FIGS. 4A-4B, are described.

In particular, an IC device 500A, shown in FIG. 5A, is similar to the IC device 400A of FIG. 4A except that a Schottky contact (e.g., diode anode) is not recessed into the N-well 112 as was the case with the contact in FIG. 4A, but is provided as a contact 150 that contacts the N-well 112 at the second face 116-2, thus also realizing a Schottky contact, and extends away from the second face 116-2. Similarly, an IC device 500B, shown in FIG. 5B, is similar to the IC device 400B of FIG. 4B except that a Schottky contact (e.g., diode anode) is not recessed into the P-well 114 as was the case with the contact in FIG. 4B, but is provided as a contact 150 that contacts the P-well 114 at the second face 116-2, thus also realizing a Schottky contact, and extends away from the second face 116-2. While the contact 150 may have a contact area that is smaller than a contact area that may be realized with the recessed contact 140, it may have the advantage of easier fabrication.

FIG. 5C illustrates an IC device 500C that is substantially the same as the IC device 500A of FIG. 5A and FIG. 5D illustrates an IC device 500D that is substantially the same as the IC device 500B of FIG. 5B, but may further include one or more conductive vias 130 as were described with reference to FIGS. 2C-2D.

The IC devices 100, 200, 300, 400, and 500 illustrated in FIGS. 1-5 do not represent an exhaustive set of IC devices and assemblies in which one or more vertical diodes extending through support structures as described herein may be provided, but merely provide examples of such structures/assemblies. Although particular arrangements of materials are discussed with reference to FIGS. 1-5, intermediate materials may be included in various portions of these figures. Note that FIGS. 1-5 are intended to show relative arrangements of some of the components therein, and that various device components of these figures may include other components that are not specifically illustrated, e.g., various interfacial layers or various additional components or layers. For example, although not specifically shown, the IC devices of FIGS. 1-5 may include a solder resist material (e.g., polyimide or similar material) and one or more bond pads formed on upper-most interconnect layers of these IC devices. The bond pads may be electrically coupled with further interconnect structure(s) and configured to route the electrical signals between the diodes of FIGS. 1-5 and various external devices. For example, solder bonds may be formed on the one or more bond pads to mechanically and/or electrically couple a chip including any of the IC devices of FIGS. 1-5 with another component (e.g., a circuit board). The IC devices of FIGS. 1-5 may have other alternative configurations to route the electrical signals from the interconnect layers, e.g., the bond pads described above may be replaced by or may further include other analogous features (e.g., posts) that route the electrical signals to external components.

Additionally, although some elements of the IC devices are illustrated in FIGS. 1-5 as being planar rectangles or formed of rectangular solids, this is simply for ease of illustration, and embodiments of various ones of these elements may be curved, rounded, or otherwise irregularly shaped as dictated by, and sometimes inevitable due to, the manufacturing processes used to fabricate semiconductor device assemblies. For example, while FIGS. 1-5 may illustrate some elements, e.g., the N-well 112, the P-well 114, the N-doped region 122, the P-doped region 124, etc., as having perfectly straight sidewall profiles, i.e., profiles where the sidewalls extend perpendicularly to the support structure 110, these idealistic profiles may not always be achievable in real-world manufacturing processes. Therefore, descriptions of various embodiments of vertical diodes extending through support structures, provided herein, are equally applicable to embodiments where various elements of the resulting IC devices look different from those shown in the figures due to manufacturing processes used to form them.

Figure 12:
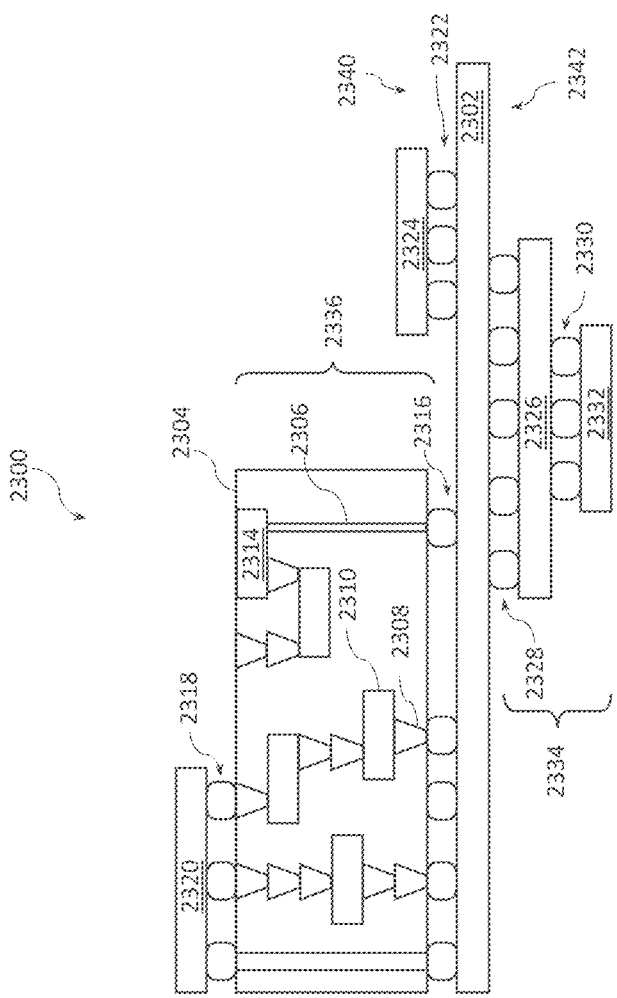
FIG. 12 is a cross-sectional side view of an IC device assembly that may include one or more IC devices having one or more vertical diodes extending through support structures in accordance with any of the embodiments of the present disclosure.
Figure 13:
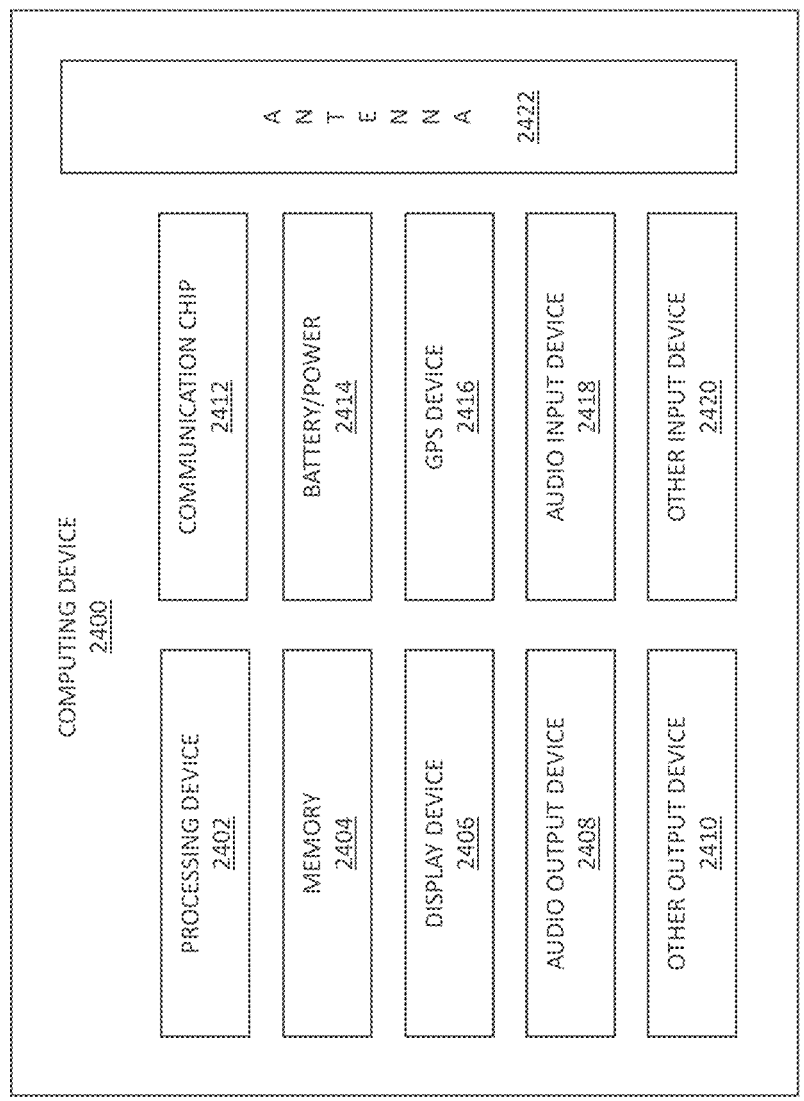
FIG. 13 is a block diagram of an example computing device that may include one or more IC devices having one or more vertical diodes extending through support structures in accordance with any of the embodiments of the present disclosure.

The IC devices implementing one or more vertical diodes extending through support structures as described herein may be manufactured using any suitable techniques. FIGS. 6-9 provide flow diagrams of example methods of manufacturing IC devices with vertical diodes extending through support structures, in accordance with various embodiments of the present disclosure. However, other examples of manufacturing any of the IC devices described herein, as well as larger devices and assemblies that include such structures (e.g., as shown in FIGS. 11-13) are also within the scope of the present disclosure.

For each of FIGS. 6-9, although the operations are illustrated once each and in a particular order, the operations may be performed in any suitable order and repeated as desired. For example, one or more operations may be performed in parallel to manufacture, substantially simultaneously, multiple vertical diodes extending through support structures as described herein. In another example, the operations may be performed in a different order to reflect the structure of a particular device assembly in which one or more vertical diodes extending through support structures as described herein will be included. In addition, the example manufacturing methods shown in FIGS. 6-9 may include other operations not specifically shown in these drawings, such as various cleaning or planarization operations as known in the art. For example, in some embodiments, the support structure 110, as well as layers of various other materials subsequently deposited thereon/in, may be cleaned prior to, after, or during any of the processes of the methods shown in FIGS. 6-9, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the IC devices/assemblies described herein may be planarized prior to, after, or during any of the processes of the methods shown in FIGS. 6-9, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Figures 6, 7:
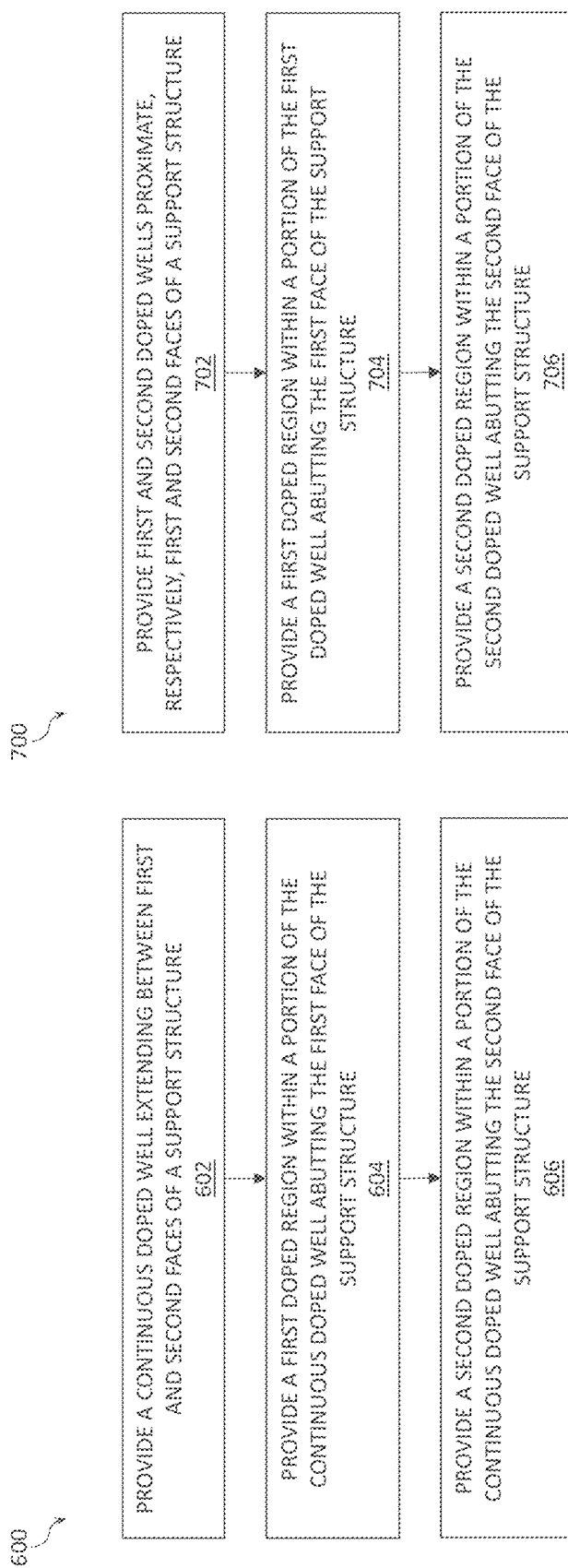

FIG. 6 illustrates a flow diagram of a method 600 that may be used to fabricate IC devices as shown in FIG. 1.

The method 600 may include a process 602 in which a continuous doped well that extends between the opposing faces of a support structure is provided. Such a doped well may take form of the N-well 112 as shown in FIG. 1A or the P-well 114 as shown in FIG. 1B, extending between the first face 116-1 and the second face 116-2 of the support structure 110. In some embodiments, the process 602 may further include thinning the support structure 110 (e.g., using a suitable polishing/grinding process to remove some of the material of the support structure 110) before the doped well is provided. In other embodiments, the process 602 may include thinning the support structure 110 after the doped well is provided. In such embodiments, the doped well may originally be fabricated to extend from the second face 116-2 towards but not reaching the other face of the support structure 110 and later the back side of the support structure 110 may be thinned to expose the doped well, thus realizing a doped well that extends through the support structure 110. Any suitable fabrication techniques may be used to provide the doped well in the process 602, such as ion implantation, possibly in combination with using a suitable mask to provide dopants in the desired portion of the support structure 110 to realize a continuous doped well as described.

The method 600 may further include a process 604 in which a first doped region is provided within a first portion of the continuous doped well provided in the process 602, and a process 606 in which a second doped region is provided within a second portion of the continuous doped well provided in the process 602. The processes 604 and 606 may be performed in any order. In the process 604, a first doped region that is within the doped well, abuts the first face of the support structure, and extends into the support structure may be provided. Such a first doped region may take form of the N-doped region 122 as shown in FIG. 1A or the P-doped region 124 as shown in FIG. 1B. In the process 606, a second doped region that is within the doped well, abuts the second face of the support structure, and extends into the support structure may be provided. Such a second doped region may take form of the P-doped region 124 as shown in FIG. 1A or the N-doped region 122 as shown in FIG. 1B. Any suitable fabrication techniques may be used to provide the doped regions in the process 604 and 606, such as ion implantation, possibly in combination with using a suitable mask to provide dopants in the desired portion of the support structure 110 to realize first and second doped regions as described.

FIG. 7 illustrates a flow diagram of a method 700 that may be used to fabricate IC devices as shown in FIG. 2 and FIG. 3.

The method 700 may include a process 702 in which first and second doped wells, each proximate a respective one of the opposing faces of a support structure, are provided. Such a first doped well may take form of the P-well 114 and such a second doped well may take form of the N-well 112 as shown in FIGS. 2A, 2C, 3A, and 3C. Alternatively, such a first doped well may take form of the N-well 112 and such a second doped well may take form of the P-well 114 as shown in FIGS. 2B, 2D, 3B, and 3D. In some embodiments, the process 702 may further include thinning the support structure 110 before the first and second doped wells are provided. Any suitable fabrication techniques may be used to provide the doped well in the process 702, such as ion implantation, possibly in combination with using a suitable mask to provide dopants in the desired portion of the support structure 110 to realize first and second doped wells at different faces of a support structure, discontinuous from one another.

The method 700 may further include a process 704 in which a first doped region is provided within the first doped well provided in the process 702, and a process 706 in which a second doped region is provided within the second doped well provided in the process 702. The processes 704 and 706 may be performed in any order. In the process 704, a first doped region that is within the first doped well, abuts the first face of the support structure, and extends into the support structure may be provided. Such a first doped region may take form of the P-doped region 124 as shown in FIGS. 2A, 2C, 3B, and 3D or the N-doped region 122 as shown in FIGS. 2B, 2D, 3A, and 3C. In the process 706, a second doped region that is within the second doped well, abuts the second face of the support structure, and extends into the support structure may be provided. Such a second doped region may take form of the N-doped region 122 as shown in FIGS. 2A, 2C, 3B, and 3D or the P-doped region 124 as shown in FIGS. 2B, 2D, 3A, and 3C. Any suitable fabrication techniques may be used to provide the doped regions in the process 704 and 706, such as ion implantation, possibly in combination with using a suitable mask to provide dopants in the desired portion of the support structure 110 to realize first and second doped regions as described.

FIG. 8 illustrates a flow diagram of a method 800 that may be used to fabricate IC devices as shown in FIG. 4.

The method 800 may include a process 802 in which a continuous doped well that extends between the opposing faces of a support structure is provided. Such a doped well may take form of the N-well 112 as shown in FIGS. 4A and 4C or the P-well 114 as shown in FIGS. 4B and 4C, extending between the first face 116-1 and the second face 116-2 of the support structure 110. Descriptions provided with respect to the process 602 are applicable to the process 802 and, in the interests of brevity, are not repeated.

The method 800 may further include a process 804 in which a doped region is provided within a portion of the continuous doped well (provided in the process 802) that abuts the first face of the support structure, and a process 806 in which a recessed contact is provided within a portion of the continuous doped well that abuts the second face of the support structure. The processes 804 and 806 may be performed in any order. Descriptions provided with respect to the process 604 are applicable to the process 804 and, in the interests of brevity, are not repeated. In the process 806, a contact that is within the continuous doped well, abuts the second face of the support structure, and extends (i.e., is recessed) into the support structure may be provided. Such a contact may take form of the contact 140 as shown in any embodiments of FIG. 4. Any suitable fabrication techniques may be used to provide the recessed contact in the process 806, such as a modified BPR process described above.

FIG. 9 illustrates a flow diagram of a method 900 that may be used to fabricate IC devices as shown in FIG. 5.

The method 900 may include a process 902, which may be substantially the same as the process 802, described above. The method 900 may further include a process 904 in which a doped region is provided within a portion of the continuous doped well (provided in the process 902) that abuts the first face of the support structure, and a process 906 in which a non-recessed contact is provided to contact a portion of the continuous doped well at the second face of the support structure. The processes 904 and 906 may be performed in any order. Descriptions provided with respect to the process 804 are applicable to the process 904 and, in the interests of brevity, are not repeated. In the process 906, a contact that is over the continuous doped well, abuts the second face of the support structure, and extends away from the support structure may be provided. Such a contact may take form of the contact 150 as shown in any embodiments of FIG. 5. Any suitable fabrication techniques may be used to provide the non-recessed contact in the process 906.

IC devices that include one or more vertical diodes extending through support structures as disclosed herein may be included in any suitable electronic device or component. FIGS. 10-13 illustrate various examples of devices and components that may include one or more vertical diodes extending through support structures as disclosed herein.

Figure 10B:
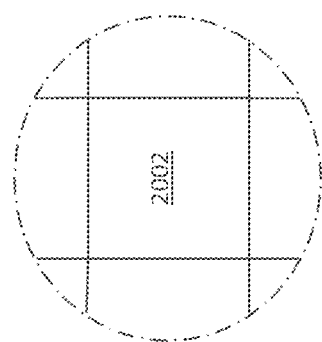
FIGS. 10A-10B are top views of a wafer and dies that may include one or more IC devices having one or more vertical diodes extending through support structures in accordance with any of the embodiments of the present disclosure.
Figure 10A:
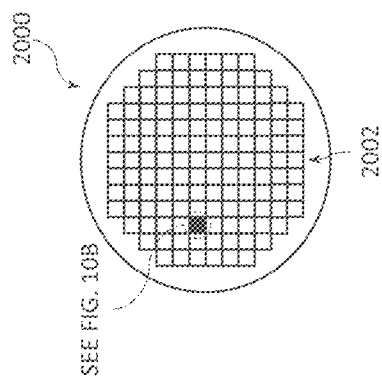

FIGS. 10A-1013 are top views of a wafer 2000 and dies 2002 that may include one or more vertical diodes extending through support structures in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 11. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more vertical diodes extending through support structures as described herein). After the fabrication of the semiconductor product is complete (e.g., after manufacture of one or more vertical diodes extending through support structures as described herein, e.g., after manufacture of any embodiments of the IC devices as described with reference to FIGS. 1-5), the wafer 2000 may undergo a singulation process in which each of the dies 2002 is separated from one another to provide discrete "chips" of the semiconductor product. In particular, devices that include one or more vertical diodes extending through support structures as disclosed herein may take the form of the wafer 2000 (e.g., not singulated) or the form of the die 2002 (e.g., singulated). The die 2002 may include one or more diodes (e.g., one or more vertical diodes extending through support structures as described herein), one or more transistors, resistors, capacitors, and other IC components as well as, optionally, supporting circuitry to route electrical signals to the vertical diodes extending through support structures and various other IC components. In some embodiments, the wafer 2000 or the die 2002 may implement an ESD protection device, an RF FE device, a memory device (e.g., a static random-access memory (SRAM) device), a logic device (e.g., an AND, OR, NAND, or NOR gate), or any other suitable circuit element. Multiple ones of these devices may be combined on a single die 2002.

FIG. 11 is a side, cross-sectional view of an example IC package 2200 that may include one or more IC devices having one or more vertical diodes extending through support structures in accordance with any of the embodiments disclosed herein. In some embodiments, the IC package 2200 may be a system-in-package (SiP).

As shown in FIG. 11, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 11 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 11 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 11 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 12.

The dies 2256 may take the form of any of the embodiments of the die 2002 discussed herein and may include any of the embodiments of an IC device having one or more vertical diodes extending through support structures, e.g., any embodiments of the IC devices as described with reference to FIGS. 1-5. In embodiments in which the IC package 2200 includes multiple dies 2256, the IC package 2200 may be referred to as a multi-chip package (MCP). Importantly, even in such embodiments of an MCP implementation of the IC package 2200, one or more vertical diodes extending through support structures may be provided in a single chip, in accordance with any of the embodiments described herein. The dies 2256 may include circuitry to perform any desired functionality. For example, one or more of the dies 2256 may be ESD protection dies, including one or more vertical diodes extending through support structures as described herein, one or more of the dies 2256 may be logic dies (e.g., silicon-based dies), one or more of the dies 2256 may be memory dies (e.g., high bandwidth memory), etc. In some embodiments, any of the dies 2256 may include one or more vertical diodes extending through support structures, e.g., as discussed above; in some embodiments, at least some of the dies 2256 may not include any vertical diodes extending through support structures.

The IC package 2200 illustrated in FIG. 11 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 11, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

FIG. 12 is a cross-sectional side view of an IC device assembly 2300 that may include components having one or more IC devices implementing one or more vertical diodes extending through support structures in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC devices implementing one or more vertical diodes extending through support structures in accordance with any of the embodiments disclosed herein; e.g., any of the IC packages discussed below with reference to the IC device assembly 2300 may take the form of any of the embodiments of the IC package 2200 discussed above with reference to FIG. 11 (e.g., may include one or more vertical diodes extending through support structures in/on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 12 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 12), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 10B), an IC device (e.g., any embodiments of the IC devices as described with reference to FIGS. 1-5), or any other suitable component. In particular, the IC package 2320 may include one or more vertical diodes extending through support structures as described herein. Although a single IC package 2320 is shown in FIG. 12, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 12, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, ESD protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC devices implementing one or more vertical diodes extending through support structures as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 12 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

FIG. 13 is a block diagram of an example computing device 2400 that may include one or more components with one or more IC devices having one or more vertical diodes extending through support structures in accordance with any of the embodiments disclosed herein. For example, any suitable ones of the components of the computing device 2400 may include a die (e.g., the die 2002 of FIG. 10B) including one or more vertical diodes extending through support structures in accordance with any of the embodiments disclosed herein. Any of the components of the computing device 2400 may include an IC device (e.g., any embodiment of the IC devices of FIGS. 1-5) and/or an IC package (e.g., the IC package 2200 of FIG. 11). Any of the components of the computing device 2400 may include an IC device assembly (e.g., the IC device assembly 2300 of FIG. 12).

A number of components are illustrated in FIG. 13 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system-on-chip (SoC) die.

Additionally, in various embodiments, the computing device 2400 may not include one or more of the components illustrated in FIG. 13, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408 but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC devices having one or more vertical diodes extending through support structures as described herein may be particularly advantageous for use as part of ESD circuits protecting power amplifiers, low-noise amplifiers, filters (including arrays of filters and filter banks), switches, or other active components. In some embodiments, IC devices having one or more vertical diodes extending through support structures as described herein may be used in PMICs, e.g., as a rectifying diode for large currents. In some embodiments, IC devices having one or more vertical diodes extending through support structures as described herein may be used in audio devices and/or in various input/output devices.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

The following paragraphs provide various examples of the embodiments disclosed herein.

Example 1 provides an IC device that includes a support structure (e.g., a substrate, a wafer, a die, or a chip) having a first face and an opposing second face; a doped well extending between the first face and the second face of the support structure; a first doped region within the doped well, extending from the first face of the support structure towards, but not reaching, a second doped region; and a second doped region within the doped well, extending from the second face of the support structure towards, but not reaching, the first doped region.

Example 2 provides the IC device according to example 1, where the first doped region is an N-type doped region and the second doped region is a P-type doped region. In various examples, the doped well may be either N-type or P-type doped well, and the support structure may either be intrinsic (i.e., substantially undoped) or a low-doped support structure, with either N-type or P-type dopants.

Example 3 provides the IC device according to any one of the preceding examples, where a dopant concentration of the doped well is higher than a dopant concentration of the support structure.

Example 4 provides the IC device according to any one of the preceding examples, where a dopant concentration of the first doped region is higher than a dopant concentration of the doped well.

Example 5 provides the IC device according to any one of the preceding examples, where a dopant concentration of the second doped region is higher than a dopant concentration of the doped well.

Example 6 provides the IC device according to any one of the preceding examples, where a dopant concentration of the support structure is lower than about $10^{16}$ dopants per cubic centimeter, e.g., lower than about $5 \times 10^{15}$ dopants per cubic centimeter, a dopant concentration of the first doped region or of the second doped region is greater than about $10^{19}$ dopants per cubic centimeter, e.g., greater than about $5 \times 10^{19}$ dopants per cubic centimeter, and a dopant concentration of the doped well is greater than the dopant concentration of the support structure and lower than the dopant concentration of the first doped region or of the second doped region.

Example 7 provides the IC device according to any one of the preceding examples, where the first doped region is separated from the second doped region by at least about 80 nanometers, including all values and ranges therein, e.g., at least 200 nanometers, or at least 450 nanometers. In general, the distance between the first doped region and the second doped region (e.g., a dimension measured along the z-axis of the example coordinate system shown) may be at least about 80% of the thickness of the support structure, e.g., at least about 90% of the thickness of the support structure.

Example 8 provides the IC device according to any one of the preceding examples, where a dimension of the first doped region in a direction perpendicular to the support structure (e.g., a dimension measured along the z-axis of the example coordinate system shown) is between about 2 and 100 nanometers, including all values and ranges therein, e.g., between about 2 and 50 nanometers, or between about 2 and 10 nanometers. In general, such a dimension may be between about 1% and 15% of the thickness of the support structure, e.g., between about 2% and 5% of the thickness of the support structure.

Example 9 provides the IC device according to any one of the preceding examples, where a dimension of the second doped region in a direction perpendicular to the support structure (e.g., a dimension measured along the z-axis of the example coordinate system shown) is between about 2 and 100 nanometers, including all values and ranges therein, e.g., between about 2 and 50 nanometers, or between about 2 and 10 nanometers. In general, such a dimension may be between about 1% and 15% of the thickness of the support structure, e.g., between about 2% and 5% of the thickness of the support structure.

Example 10 provides the IC device according to any one of the preceding examples, where a distance between the first face and the second face of the support structure (e.g., a dimension measured along the z-axis of the example coordinate system shown) is between about 100 and 5000 nanometers, including all values and ranges therein, e.g., between about 200 and 2000 nanometers, or between about 400 and 600 nanometers.

Example 11 provides the IC device according to any one of the preceding examples, further including a first contact, electrically coupled to the first doped region at the first face of the support structure; and a second contact, electrically coupled to the second doped region at the second face of the support structure.

Example 12 provides an IC device that includes a support structure (e.g., a substrate, a wafer, a die, or a chip) having a first face and an opposing second face; a first doped well and a second doped well, where the first doped well extends from the first face of the support structure towards, but not reaching, the second doped well, and where the second doped well extends from the second face of the support structure towards, but not reaching, the first doped well; and a first doped region and a second doped region, where the first doped region is within the first doped well and extends from the first face of the support structure towards, but not reaching, the end of the first doped well (i.e., the first doped region is shallower than the first doped well), and where the second doped region is within the second doped well and extends from the second face of the support structure towards, but not reaching, the end of the second doped well (i.e., the second doped region is shallower than the second doped well).

Example 13 provides the IC device according to example 12, where the first doped well and the first doped region include dopants of a first type (e.g., N-type dopants), and the second doped well and the second doped region include dopants of a second type (e.g., P-type dopants).

Example 14 provides the IC device according to example 12, where the first doped well and the second doped region include dopants of a first type (e.g., N-type dopants), and the second doped well and the first doped region include dopants of a second type (e.g., P-type dopants).

Example 15 provides the IC device according to examples 12 or 13, where the first type is N-type dopants and the second type is P-type dopants.

Example 16 provides the IC device according to examples 12 or 13, where the first type is P-type dopants and the second type is N-type dopants.

Example 17 provides the IC device according to any one of examples 12-16, where the support structure includes either P-type dopants or N-type dopants. In various further examples, the support structure may be intrinsic.

Example 18 provides the IC device according to any one of examples 12-17, where a dopant concentration of each of the first doped well and the second doped well is higher than a dopant concentration of the support structure.

Example 19 provides the IC device according to any one of examples 12-18, where a dopant concentration of the first doped region is higher than a dopant concentration of the first doped well.

Example 20 provides the IC device according to any one of examples 12-19, where a dopant concentration of the second doped region is higher than a dopant concentration of the second doped well.

Example 21 provides the IC device according to any one of examples 12-20, where a dopant concentration of the support structure is lower than about $10^{16}$ dopants per cubic centimeter, e.g., lower than about $5 \times 10^{15}$ dopants per cubic centimeter, a dopant concentration of the first doped region or of the second doped region is greater than about $10^{19}$ dopants per cubic centimeter, e.g., greater than about $5 \times 10^{19}$ dopants per cubic centimeter, and a dopant concentration of the first doped well or the second doped well is greater than the dopant concentration of the support structure and lower than the dopant concentration of the first doped region and the dopant concentration of the second doped region.

Example 22 provides the IC device according to any one of examples 12-21, where the first doped region is separated from the second doped region by at least 80 nanometers, including all values and ranges therein, e.g., at least 200 nanometers, or at least 450 nanometers. In general, the distance between the first doped region and the second doped region may be at least about 80% of a thickness of the support structure, e.g., at least about 90% of the thickness of the support structure.

Example 23 provides the IC device according to any one of examples 12-22, where the first doped well is separated from the second doped well by at least 50 nanometers, including all values and ranges therein, e.g., at least 100 nanometers, or at least 200 nanometers. In general, the distance between the first doped well and the second doped well may be at least about 10% of a thickness of the support structure, e.g., at least about 40% of the thickness of the support structure.

Example 24 provides the IC device according to any one of examples 12-23, where a dimension of the first doped region in a direction perpendicular to the support structure is between about 1% and 15% of a thickness of the support structure, e.g., between about 2% and 5% of the thickness of the support structure, e.g., between 2 and 100 nanometers, including all values and ranges therein, e.g., between 2 and 50 nanometers, or between 2 and 10 nanometers.

Example 25 provides the IC device according to any one of examples 12-24, where a dimension of the first doped well in a direction perpendicular to the support structure is between about 50 and 4000 nanometers, including all values and ranges therein, e.g., between about 100 and 1000 nanometers, or between 100 and 250 nanometers. In general, such a dimension may be between about 10% and 80% of a thickness of the support structure, e.g., between about 20 and 30% of the thickness of the support structure.

Example 26 provides the IC device according to any one of examples 12-25, where a dimension of the second doped region in a direction perpendicular to the support structure is between about 1% and 15% of a thickness of the support structure, e.g., between about 2% and 5% of the thickness of the support structure, e.g., between 2 and 100 nanometers, including all values and ranges therein, e.g., between 2 and 50 nanometers, or between 2 and 10 nanometers.

Example 27 provides the IC device according to any one of examples 12-26, where a dimension of the second doped well in a direction perpendicular to the support structure is between about 50 and 4000 nanometers, including all values and ranges therein, e.g., between about 100 and 1000 nanometers, or between about 100 and 250 nanometers. In general, such a dimension may be between about 10% and 80% of a thickness of the support structure, e.g., between about 20 and 30% of the thickness of the support structure.

Example 28 provides the IC device according to any one of examples 12-27, where a distance between the first face and the second face of the support structure is between 100 and 5000 nanometers, including all values and ranges therein, e.g., between 200 and 2000 nanometers, or between 400 and 600 nanometers.

Example 29 provides the IC device according to any one of examples 12-28, further including a first contact, electrically coupled to the first doped region at the first face of the support structure; and a second contact, electrically coupled to the second doped region at the second face of the support structure.

Example 30 provides the IC device according to any one of examples 12-28, further including a via opening extending between the first face and the second face of the support structure, the via opening lined with at least one insulator material and at least partially filled with at least one electrically conductive material.

Example 31 provides the IC device according to example 30, where a cross-sectional dimension (e.g., a diameter) of the via in a first plane is larger than the cross-sectional dimension of the via in the second plane, where the first plane is closer to the first face of the support structure than the second plane.

Example 32 provides the IC device according to examples 30 or 31, where a distance from the electrically conductive material to the first doped well or to the second doped well is between about 10 and 250 nanometers, including all values and ranges therein, e.g., between 25 and 150 nanometers, or between 25 and 75 nanometers.

Example 33 provides an IC device that includes a support structure (e.g., a substrate, a wafer, a die, or a chip) having a first face and an opposing second face; a doped well extending between the first face and the second face of the support structure; a doped region within the doped well, extending from the first face of the support structure towards, but not reaching, a contact at the second face of the support structure; and a contact having a portion at the second face of the support structure (e.g., abutting the second face of the support structure).

Example 34 provides the IC device according to example 33, where the doped well and the doped region include dopants of same type (e.g., both include N-type dopants).

Example 35 provides the IC device according to any one of examples 33-34, where the support structure includes either P-type dopants or N-type dopants. In various further examples, the support structure may be intrinsic.

Example 36 provides the IC device according to any one of examples 33-35, where the contact has a portion that extends from the second face of the support structure into the doped well, towards, but not reaching, the doped region.

Example 37 provides the IC device according to example 36, where a dimension of the portion that extends from the second face of the support structure into the doped well in a direction perpendicular to the support structure (i.e., a dimension measured along the z-axis of the example coordinate system shown) is between about 20 and 2000 nanometers, including all values and ranges therein, e.g., between about 25 and 500 nanometers, or about between 50 and 150 nanometers. In general, such a dimension may be between about 5% and 70% of a thickness of the support structure, e.g., between about 10% and 30% of the thickness of the support structure.

Example 38 provides the IC device according to examples 36 or 37, where a width (e.g., a dimension measured along the x-axis of the example coordinate system shown) of the portion that extends from the second face of the support structure into the doped well is between about 25 and 2000 nanometers, including all values and ranges therein, e.g., between about 100 and 1000 nanometers, or between about 250 and 750 nanometers.

Example 39 provides the IC device according to any one of examples 36-38, where a distance between the portion that extends from the second face of the support structure into the doped well and the doped region (e.g., a dimension measured along the z-axis of the example coordinate system shown) is between about 100 and 4000 nanometers, including all values and ranges therein, e.g., between about 200 and 1000 nanometers, or between about 300 and 400 nanometers.

Example 40 provides the IC device according to any one of examples 36-39, where the contact further has a portion that extends from the second face of the support structure away from the support structure.

Example 41 provides the IC device according to any one of examples 33-35, where the contact has a portion that extends from the second face of the support structure away from the support structure.

Example 42 provides the IC device according to any one of examples 33-41, where a dopant concentration of the doped well is higher than a dopant concentration of the support structure.

Example 43 provides the IC device according to any one of examples 33-42, where a dopant concentration of the doped region is higher than a dopant concentration of the doped well.

Example 44 provides the IC device according to any one of examples 33-43, where a dopant concentration of the support structure is lower than about $10^{16}$ dopants per cubic centimeter, e.g., lower than about $5 \times 10^{15}$ dopants per cubic centimeter, a dopant concentration of the doped region is greater than about $10^{19}$ dopants per cubic centimeter, e.g., greater than about $5 \times 10^{19}$ dopants per cubic centimeter, and a dopant concentration of the doped well is greater than the dopant concentration of the support structure and lower than the dopant concentration of the doped region.

Example 45 provides the IC device according to any one of examples 33-44, where a dimension of the doped region in a direction perpendicular to the support structure (e.g., a dimension measured along the z-axis of the example coordinate system shown) is between about 2 and 100 nanometers, including all values and ranges therein, e.g., between about 2 and 50 nanometers, or between about 2 and 10 nanometers. In general, such a dimension may be between about 1% and 15% of the thickness of the support structure, e.g., between about 2% and 5% of the thickness of the support structure.

Example 46 provides the IC device according to any one of examples 33-45, further including a via opening extending between the first face and the second face of the support structure, the via opening lined with at least one insulator material and at least partially filled with at least one electrically conductive material.

Example 47 provides the IC device according to example 46, where a cross-sectional dimension (e.g., a diameter) of the via in a first plane is larger than the cross-sectional dimension of the via in the second plane, where the first plane is closer to the first face of the support structure than the second plane.

Example 48 provides the IC device according to examples 46 or 47, where a distance from the electrically conductive material to the doped well is between about 10 and 250 nanometers, including all values and ranges therein, e.g., between 25 and 150 nanometers, or between 25 and 75 nanometers.

Example 49 provides an IC package that includes an IC die, the IC die including an IC device according to any one of the preceding examples, e.g., an IC device any one of examples 1-48, and a further IC component, coupled to the IC die.

Example 50 provides the IC package according to example 49, where the further IC component includes one of a package substrate, an interposer, or a further IC die.

Example 51 provides an electronic device (e.g., a computing device) that includes a carrier substrate; and an IC die coupled to the carrier substrate, where the IC die includes the IC device according to any one of examples 1-48, and/or is included in the IC package according to any one of examples 49-50.

Example 52 provides the electronic device according to example 51, where the electronic device is a wearable or handheld electronic device.

Example 53 provides the electronic device according to examples 51 or 52, where the electronic device further includes one or more communication chips and an antenna.

Example 54 provides the electronic device according to any one of examples 51-53, where the carrier substrate is a motherboard.

Example 55 provides a method for fabricating an IC device according to any one of the preceding examples, the method including processes as described with reference to FIGS. 6-9.

Example 56 provides the method according to example 56, further including processes for forming the IC package according to any one of the preceding examples.

Example 57 provides the method according to examples 56 or 57, further including processes for forming the electronic device according to any one of the preceding examples.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a substrate having a first face and an opposing second face;
a first doped well and a second doped well, wherein the first doped well extends from the first face of the substrate towards, but not reaching, the second doped well, and wherein the second doped well extends from the second face of the substrate towards, but not reaching, the first doped well; and
a first doped region and a second doped region, wherein the first doped region is within the first doped well and abuts the first face of the substrate, and wherein the second doped region is within the second doped well and abuts the second face of the substrate,
wherein:
the first doped well and the first doped region include dopants of a first type, and
the second doped well and the second doped region include dopants of a second type.

2. The IC device according to claim 1, wherein:
a dopant concentration of the substrate is lower than about $10^{16}$ dopants per cubic centimeter,
a dopant concentration of the first doped region or of the second doped region is greater than about $10^{19}$ dopants per cubic centimeter, and
a dopant concentration of the first doped well or the second doped well is greater than the dopant concentration of the substrate and lower than the dopant concentration of the first doped region and the dopant concentration of the second doped region.

3. The IC device according to claim 1, wherein the first doped region is separated from the second doped region by at least about 80% of a thickness of the substrate.

4. The IC device according to claim 1, wherein the first doped well is separated from the second doped well by at least about 10% of a thickness of the substrate.

5. The IC device according to claim 1, wherein a dimension of the first doped region or a dimension of the second doped region in a direction perpendicular to the substrate is between about 1% and 15% of a thickness of the substrate.

6. The IC device according to claim 1, wherein a dimension of the first doped well or a dimension of the second doped region in a direction perpendicular to the substrate is between about 10% and 80% of a thickness of the substrate.

7. The IC device according to claim 1, wherein a distance between the first face and the second face of the substrate is between 100 and 5000 nanometers.

8. The IC device according to claim 1, further comprising a via opening extending between the first face and the second face of the substrate, the via opening lined with at least one insulator material and at least partially filled with at least one electrically conductive material.

9. The IC device according to claim 8, wherein a cross-sectional dimension of the via in a first plane is larger than the cross-sectional dimension of the via in a second plane, where the first plane is closer to the first face of the substrate than the second plane.

10. The IC device according to claim 1, wherein the first doped well encloses sidewalls of the first doped region.

11. An integrated circuit (IC) package, comprising:
an IC die; and
a component coupled to the IC die,
wherein the IC die includes:
  a first doped well and a second doped well opposite one another,
  an intermediate material having a portion between the first doped well and the second doped well, and
  a first doped region and a second doped region, wherein the first doped region is within the first doped well and the second doped region is within the second doped well, wherein the first doped well and the first doped region include dopants of a first type, and wherein the second doped well and the second doped region include dopants of a second type.

12. The IC package according to claim 11, wherein:
a dopant concentration of the intermediate material is lower than about $10^{16}$ dopants per cubic centimeter, and
a dopant concentration of the first doped region or of the second doped region is greater than about $10^{19}$ dopants per cubic centimeter.

13. The IC package according to claim 12, wherein:
a dopant concentration of the first doped well or the second doped well is greater than the dopant concentration of the intermediate material and lower than the dopant concentration of the first doped region and the dopant concentration of the second doped region.

14. The IC package according to claim 11, wherein a distance between the first doped well and the second doped well is at least 50 nanometers.

15. The IC package according to claim 11, wherein:
the portion of the intermediate material is a first portion of the intermediate material, and
a second portion of the intermediate material encloses sidewalls of the first doped well and the second doped well.

16. The IC package according to claim 11, wherein the first doped well encloses sidewalls of the first doped region.

17. The IC package according to claim 16, wherein the second doped well encloses sidewalls of the second doped region.

18. The IC package according to claim 11, wherein the component is one of another IC die, an interposer, a package substrate, or a circuit board.

19. An integrated circuit (IC) die, comprising:
a first doped well and a second doped well opposite one another;
an intermediate material having a portion between the first doped well and the second doped well; and
a first doped region and a second doped region,
wherein:
  the first doped region is within the first doped well,
  the second doped region is within the second doped well,
  the first doped well and the first doped region include dopants of a first type, and
  the second doped well and the second doped region include dopants of a second type.

20. The IC die according to claim 19, wherein:
the IC die has a first face and an opposing second face,
the first doped well extends from the first face of the IC die towards the second doped well, and
the second doped well extends from the second face of the IC die towards the first doped well.

* * * * *